US012677488B2

(12) United States Patent
Yang et al.

(10) Patent No.: US 12,677,488 B2
(45) Date of Patent: Jul. 7, 2026

(54) IMAGE SENSING DEVICE AND METHODS OF MANUFACTURING THE SAME

(71) Applicant: TAIWAN SEMICONDUCTOR MANUFACTURING COMPANY, LTD., Hsinchu (TW)

(72) Inventors: Ming-Hsien Yang, Taichung (TW); Chun-Hao Chou, Tainan (TW); Kuo-Cheng Lee, Tainan (TW); Chung-Liang Cheng, Changhua (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 837 days.

(21) Appl. No.: 17/669,962

(22) Filed: Feb. 11, 2022

(65) Prior Publication Data

US 2022/0415938 A1 Dec. 29, 2022

Related U.S. Application Data

(60) Provisional application No. 63/215,019, filed on Jun. 25, 2021.

(51) Int. Cl.
 H01L 27/146 (2006.01)
 H10F 39/00 (2025.01)
 (Continued)

(52) U.S. Cl.
 CPC ......... H10F 39/802 (2025.01); H10F 39/014 (2025.01); H10F 39/18 (2025.01); H10F 39/8037 (2025.01); H10P 14/40 (2026.01);

*H10P 14/60* (2026.01); *H10P 14/683* (2026.01); *H10P 32/30* (2026.01); *H10P 95/92* (2026.01)

(58) Field of Classification Search
 CPC ......... H01L 21/02107; H01L 21/02118; H01L 21/041; H01L 21/283; H01L 21/3215; H10F 39/014; H10F 39/18; H10F 39/8037; H10F 39/12–199; H10F 39/802–80377; H10F 39/804; H10F 39/805–8057; H10F 39/806–8067; H10F 39/807; H10F 39/811
 See application file for complete search history.

(56) References Cited

U.S. PATENT DOCUMENTS

| 7,944,285 B1 | 5/2011 | Thirunavukarasu et al. |
| 2003/0071681 A1 | 4/2003 | Fujimori |
| | (Continued) | |

FOREIGN PATENT DOCUMENTS

| DE | 102017110434 | 5/2018 |
| JP | 3694793 | 9/2005 |
| | (Continued) | |

*Primary Examiner* — Cuong B Nguyen
(74) *Attorney, Agent, or Firm* — NZ Car Law Office

(57) ABSTRACT

Image sensing devices according to present disclosure include metal gate structures in a pixel device. Particularly, the metal gate structures include a ferroelectric layer and a conductive layer to form a negative capacitance device in the gate stack. As a result, the transistors in the pixel device have reduced threshold swing, improved gain and reduced threshold voltage shift. The pixel device according to the present disclosure includes a combination of metal gate and polycrystalline gate, which provides flexibility in pixel device design and improves performance.

20 Claims, 24 Drawing Sheets

(51) Int. Cl.

| | | |
|---|---|---|
| *H10F 39/18* | (2025.01) | |
| *H10P 14/40* | (2026.01) | |
| *H10P 14/60* | (2026.01) | |
| *H10P 14/68* | (2026.01) | |
| *H10P 32/30* | (2026.01) | |
| *H10P 95/00* | (2026.01) | |

(56) References Cited

U.S. PATENT DOCUMENTS

| | | | |
|---|---|---|---|
| 2004/0080340 A1 | 4/2004 | Hidaka | |
| 2004/0183508 A1 | 9/2004 | Toyoda et al. | |
| 2006/0091913 A1 | 5/2006 | Bhattacharya | |
| 2007/0069316 A1* | 3/2007 | Lee | H10F 39/014 |
| | | | 257/431 |
| 2007/0145440 A1* | 6/2007 | Lim | H10F 39/802 |
| | | | 257/E27.131 |
| 2008/0012424 A1 | 1/2008 | Shin et al. | |
| 2014/0103412 A1* | 4/2014 | Lee | H10F 39/8033 |
| | | | 257/292 |
| 2016/0005749 A1 | 1/2016 | Li et al. | |
| 2016/0211849 A1 | 7/2016 | Shin et al. | |
| 2018/0076334 A1 | 3/2018 | Ando et al. | |
| 2019/0058049 A1 | 2/2019 | Then et al. | |
| 2019/0067206 A1 | 2/2019 | Bedeschi et al. | |
| 2019/0333962 A1* | 10/2019 | He | H10F 39/18 |

FOREIGN PATENT DOCUMENTS

| | | |
|---|---|---|
| KR | 20160040356 | 4/2016 |
| KR | 20160089141 | 7/2016 |
| TW | 201707374 | 2/2017 |

* cited by examiner

402 Providing a substrate having a pixel region formed therein

404 Forming first gate structures with a first composition over the pixel region 406 Doping the substrate to form a radiation region, a floating diffusion region and source/drain regions 408 Depositing a contact etch stop layer and an interlayer dielectric layer over the substrate 410 Patterning the substrate to expose and remove a portion of the first gate structures 412 Forming second gate structures 414 Forming contact features and interconnect structures over the first and second gate structures 416 Attaching a color filter layer and a lens to the substrate

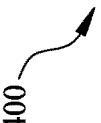

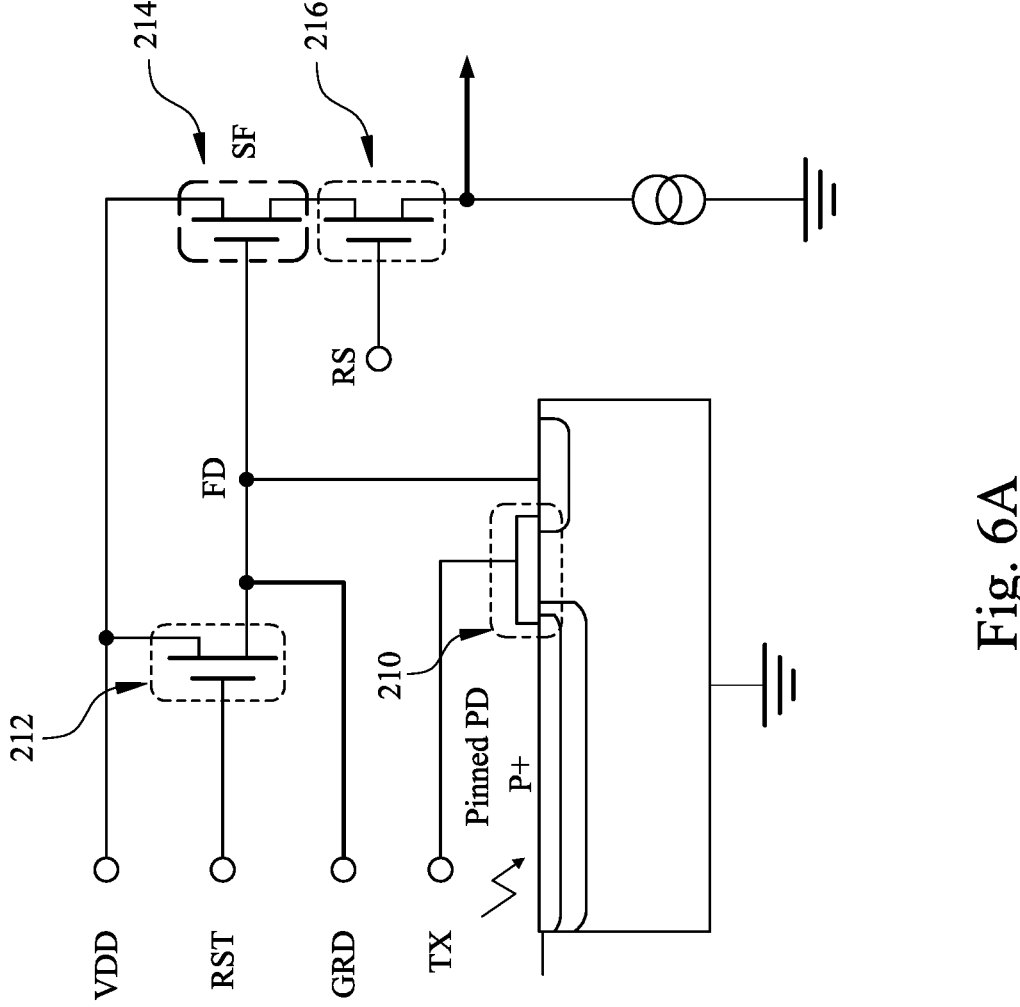
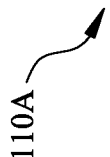
Fig. 6A

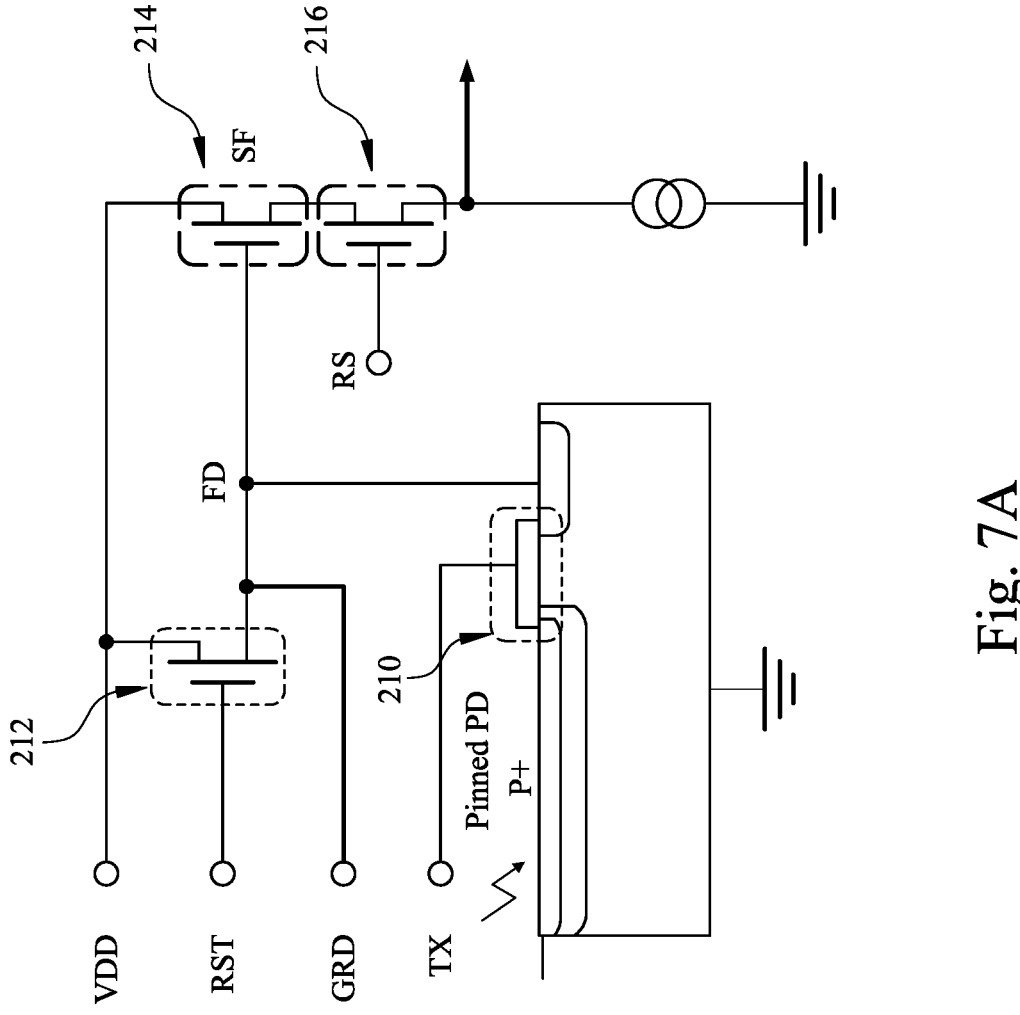
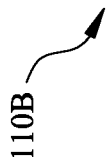
Fig. 7A

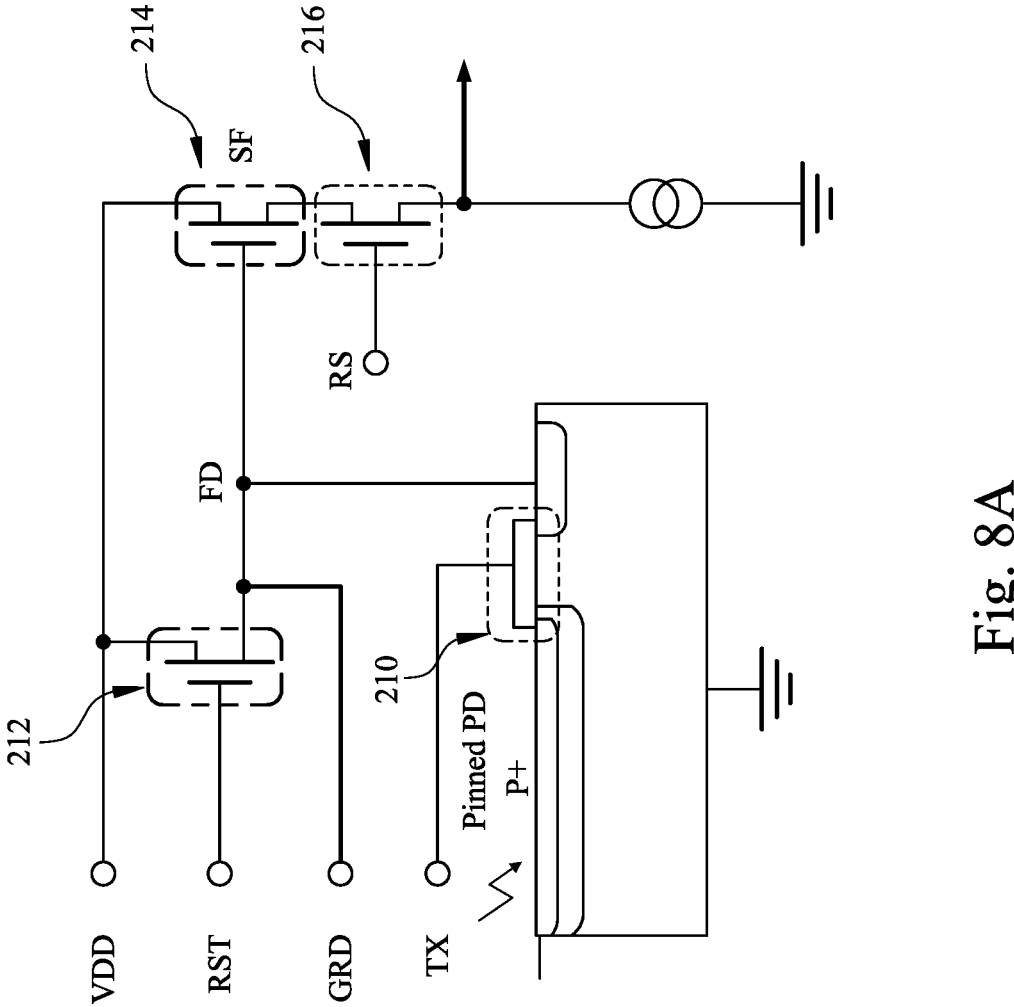
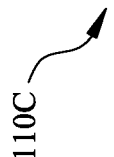
Fig. 8A

IMAGE SENSING DEVICE AND METHODS OF MANUFACTURING THE SAME

BACKGROUND

An image sensing device is one of the building blocks in a digital imaging system such as a digital still or a video camera. An image-sensor device includes a pixel array (or grid) for detecting light and recording intensity (brightness) of the detected light. The pixel array responds to the light by accumulating a charge. For example, the more light is received by the pixel, the higher the charge. The accumulated charge is then used by circuitry to provide a color and brightness signal for use in a suitable application, such as a digital camera. One type of image sensor is complementary metal-oxide-semiconductor (CMOS) image sensor (CIS).

Due to device scaling, improvements to image sensing technology are continually being made to further improve the quality of image sensing devices. However, the MOS transistors in state-of-the-art CIS device encounter challenges, such as threshold voltage shift, gain limitation, with scaling. Therefore, there is a need for improved CIS device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a flow chart of a method for manufacturing an image sensing device according to embodiments of the present disclosure.

FIG. 6A is a schematic circuit diagram of a pixel device according to embodiments of the present disclosure.

FIG. 7A is a schematic circuit diagram of a pixel device according to embodiments of the present disclosure.

FIG. 8A is a schematic circuit diagram of a pixel device according to embodiments of the present disclosure.

DETAILED DESCRIPTION

Figure 1:
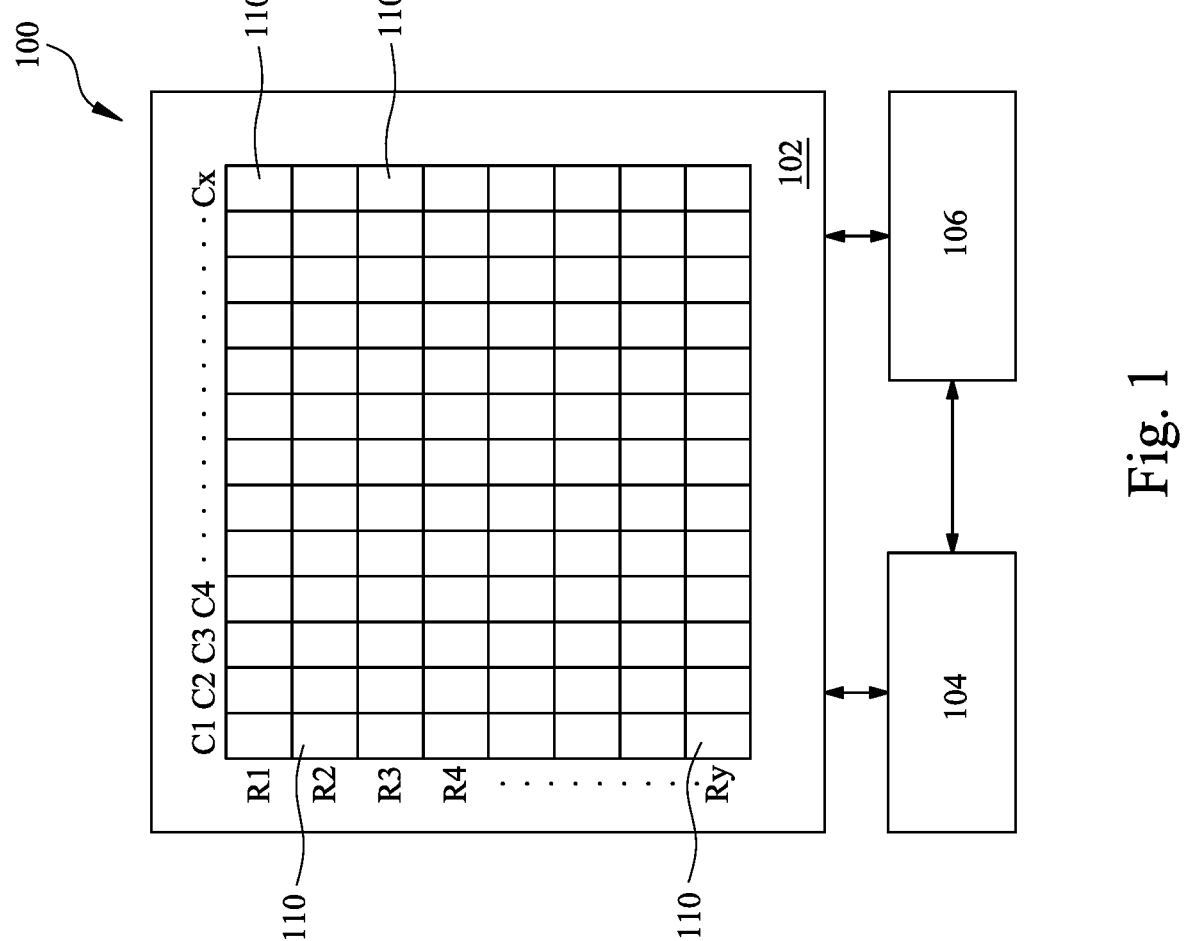
FIG. 1 is a schematic top view of an image sensing device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates an image sensing device with pixel devices including transistors with a gate structure formed by a replacement process sequence. In some embodiments, the pixel device includes one or more transistors having a gate structure including a ferroelectric layer. The ferroelectric layer forms a negative capacitance device in a gate stack resulting in reduced subthreshold swing, improved gain and reduced threshold voltage shift. In some embodiments, a transfer transistor connected to a photodiode may include a gate structure including polycrystalline silicon. The combination of metal gate and polycrystalline gate provides flexibility in pixel device design and improves performance.

FIG. 1 is a schematic top view of an image sensing device 100 according to embodiments of the present disclosure. In some embodiments, the image sensing device 100 may include a backside illuminated (BSI) image sensing device, a front side illuminated (FSI) image sensing device, or a combination thereof.

The image sensing device 100 includes a pixel array area 102 having an array of pixel devices 110. For example, the pixel devices 110 are arranged into columns $C_1$-$C_x$ and rows $R_1$-$R_y$. The term "pixel device" refers to a unit cell containing features such as a photodetector and various circuits. The unit cell may include various semiconductor features for converting electromagnetic radiation into an electrical signal. The photodetectors in the pixel devices 110 may include photodiodes, complimentary metal-oxide-semiconductor (CMOS) image sensors, charged coupling device (CCD) sensors, active sensors, passive sensors, other applicable sensors, or a combination thereof. In some embodiments, the pixel devices 110 are designed to have various sensor types. One group of pixel devices 110 may be CMOS image sensors, and another group of pixel devices 110 may be another type of sensors, such as passive sensors. In some embodiments, each pixel device 110 includes a photodetector, such as a photogate-type photodetector, for recording intensity or brightness of light (radiation). Each pixel device 110 may also include various semiconductor devices, such as various transistors. In some embodiments, one or more of the various transistors in the pixel devices 110 may include a metal gate structure. In some embodiments, one or more the various transistors in the pixel device 110 include a gate structure having a ferroelectric film.

The imaging sensing device 100 may further include a memory 104 and a controller 106 in connection with the pixel devices 110 in the pixel array area 102. After a period of exposure, the electrical signal in the pixel devices 110 is transferred and stored in memory cells in the memory 104 by signals from the controller 106. The controller 106 determines the light intensity recorded at individual pixel device 110 to reconstruct a representation of an optical image.

Figure 2A:
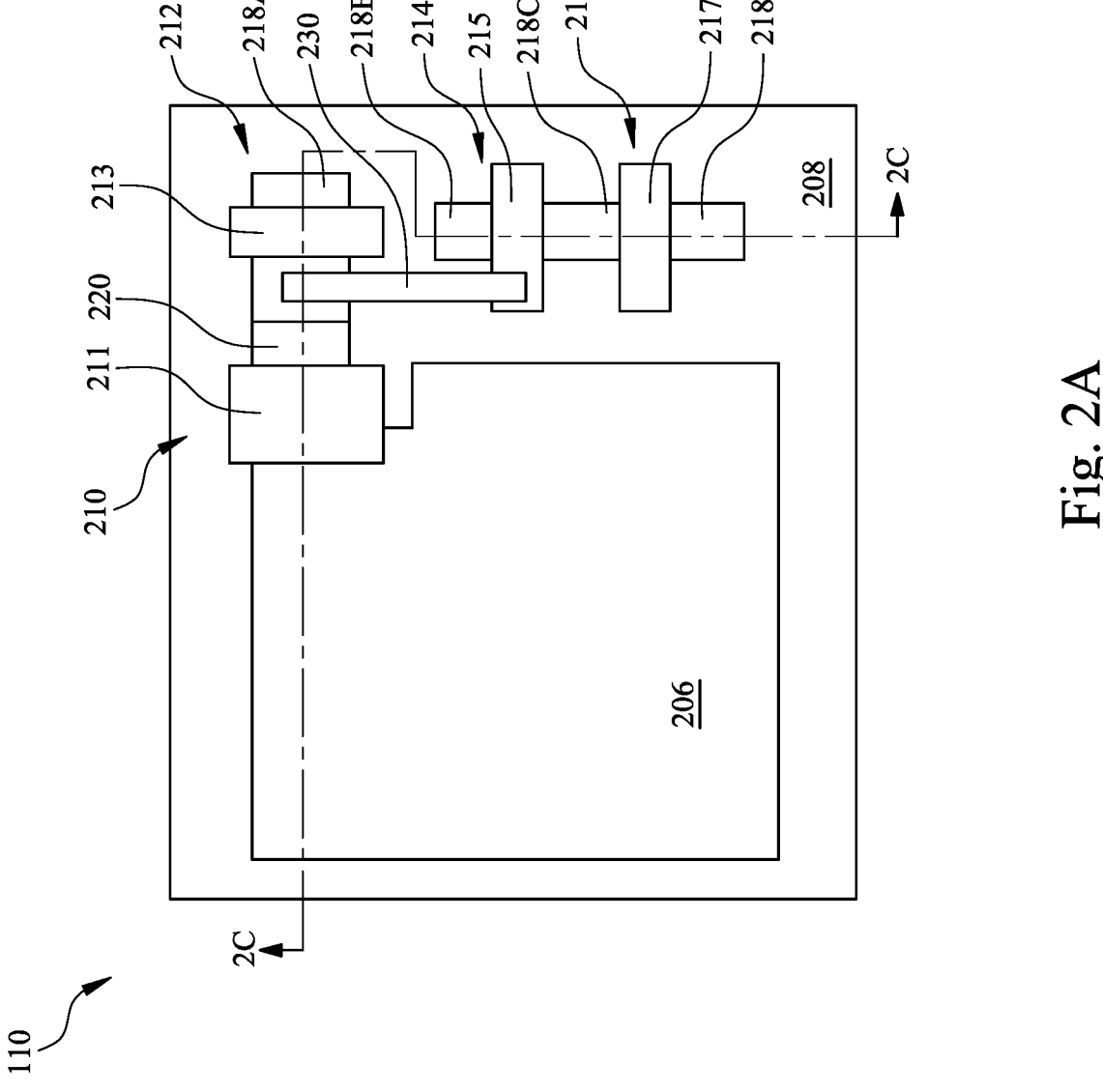
FIG. 2A is a schematic top view of a pixel device according to embodiments of the present disclosure.
Figure 2B:
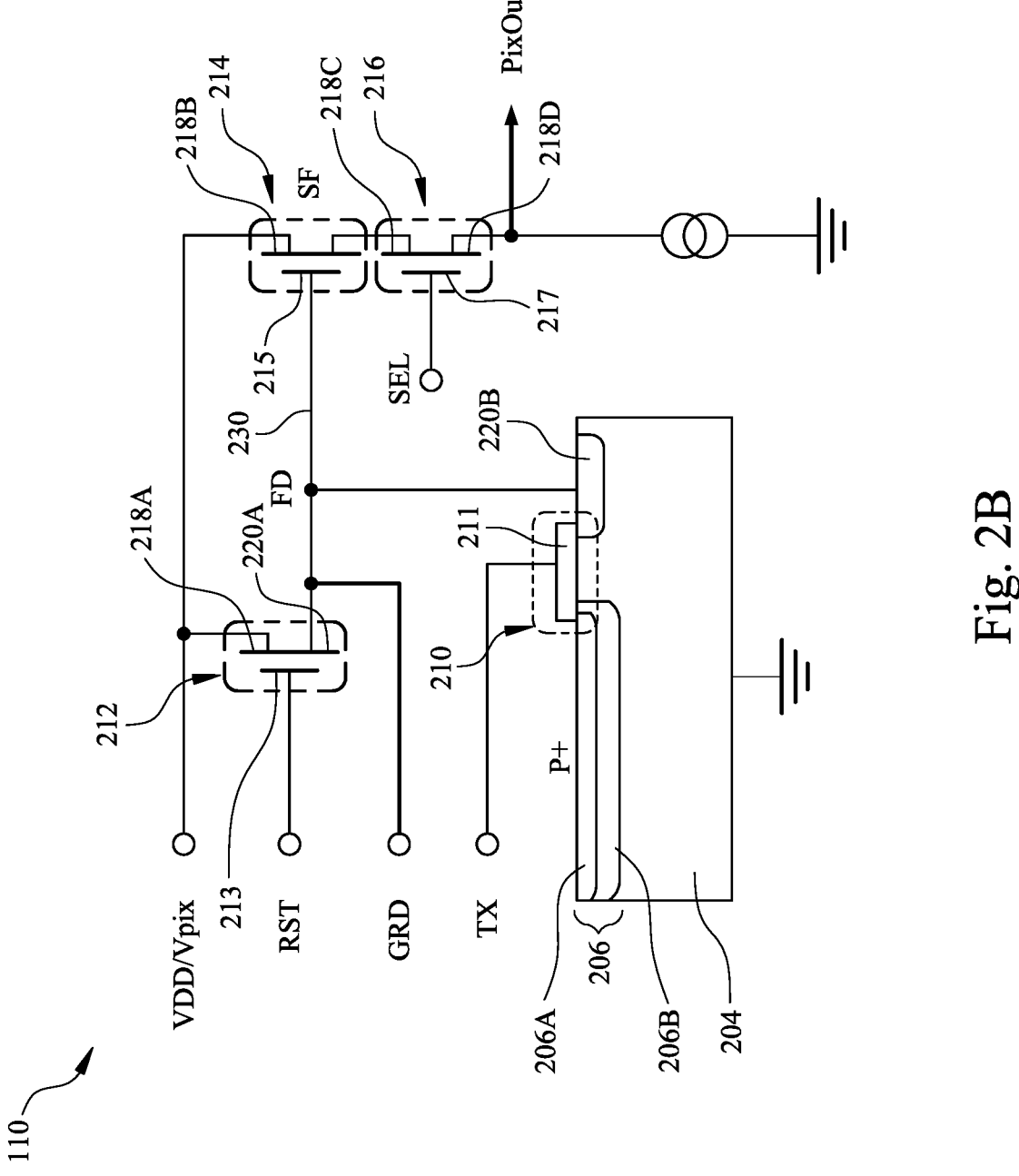
FIG. 2B is a schematic circuit diagram of the pixel device according to embodiments of the present disclosure.

FIG. 2A is a schematic top view of the pixel device 110 according to embodiments of the present disclosure. FIG. 2B is a schematic circuit diagram of the pixel device 110. The pixel device 110 may be formed over a semiconductor substrate. The pixel device 110 may include an isolation structure 208 formed in the semiconductor substrate to isolate devices or doped regions formed in the pixel device 110. In some embodiments, the pixel device 110 includes a radiation region 206 and various doped regions 218A-218D, and 220 separated by the isolation structure 208. The radiation region 206 may be a photodetector formed from doped layers in a semiconductor substrate. In some embodiments, the radiation region 206 includes a photo sensitive device, such as a photodiode, for recording intensity or brightness of radiation. Even though one radiation region 206 is shown in FIG. 2A, the pixel device 110 may include more than one radiation regions 206, for example four radiation regions 206, to accumulate charge from photons incident on the pixel device 110.

The pixel device 110 contains various transistors for controlling the photo sensitive device in the radiation region 206. In some embodiments, the pixel device 110 includes a transfer transistor 210, a reset transistor 212, a source-follower transistor 214, and a select transistor 216. The pixel device 110 may include other suitable transistors, such as a shutter gate transistor, a storage transfer transistor, or a combination thereof.

The dope regions 218A-218D and 220A-B in the pixel device 110 facilitate for formation of the various transistors. The doped regions 218A-218D and 220 serve as source/drain of the various transistors. The doped region 220A forms one of the source/drain for the transfer transistor 210 and the reset transistor 212. The doped regions 220A-220B is also referred to as a floating diffusion (FD) region. The doped region 218A is one of the source/drain for the reset transistor 212. The doped regions 218B and 218C are source/drain for the source-follower transistor 214. The doped regions 218C and 218D are source/drain for the select transistor 216.

The transfer transistor 210 includes a transfer gate 211 over a channel region between the doped region 220A and the radiation region 206. The reset transistor 212 includes a reset gate 213 over a channel region between the doped regions 220B and 218A. The source-follower transistor 214 includes a source-follower gate 215 over a channel region between the doped regions 218B and 218C. The select transistor 216 includes a select gate 217 over a channel region between the doped regions 218C and 218D. The doped region 220A is electrically connected to the source-follower gate 215 of the source-follower transistor 214. In some embodiments, a conductive feature 230 overlaps a portion of the source-follower gate 215 of the source-follower transistor 214 and connects to the doped region 220A.

As shown in the circuit diagram in FIG. 2B, the transfer transistor 210 is controlled by a transfer signal TX connected to the transfer gate 211. The reset transistor 212 is controlled by a reset signal RST connected to the reset gate 213. The select transistor 216 is controlled by a select signal SEL connected to the select gate 217. When the transfer transistor 210 is turn on, electrons in the radiation region 206 are transferred to the doped region 220B through the channel region 231 between the radiation region 206 and the doped region 220B. Through the connection of the conductive feature 230, the source-follower transistor 214 may convert the electrons from the doped region 220A to a voltage in the doped region 218C. When the select transistor 216 is turned on, the voltage in the doped region 218C is read by circuit in the controller 106 and the memory 104 through a PixOut signal line connected to the dope region 218D. The reset transistor 212 may act as a switch to reset the doped regions 220A-B. When the reset transistor 212 is turned on, the doped regions 220A-B are connected to a power supply VDD to clear all accumulated electrons.

Figure 2C:
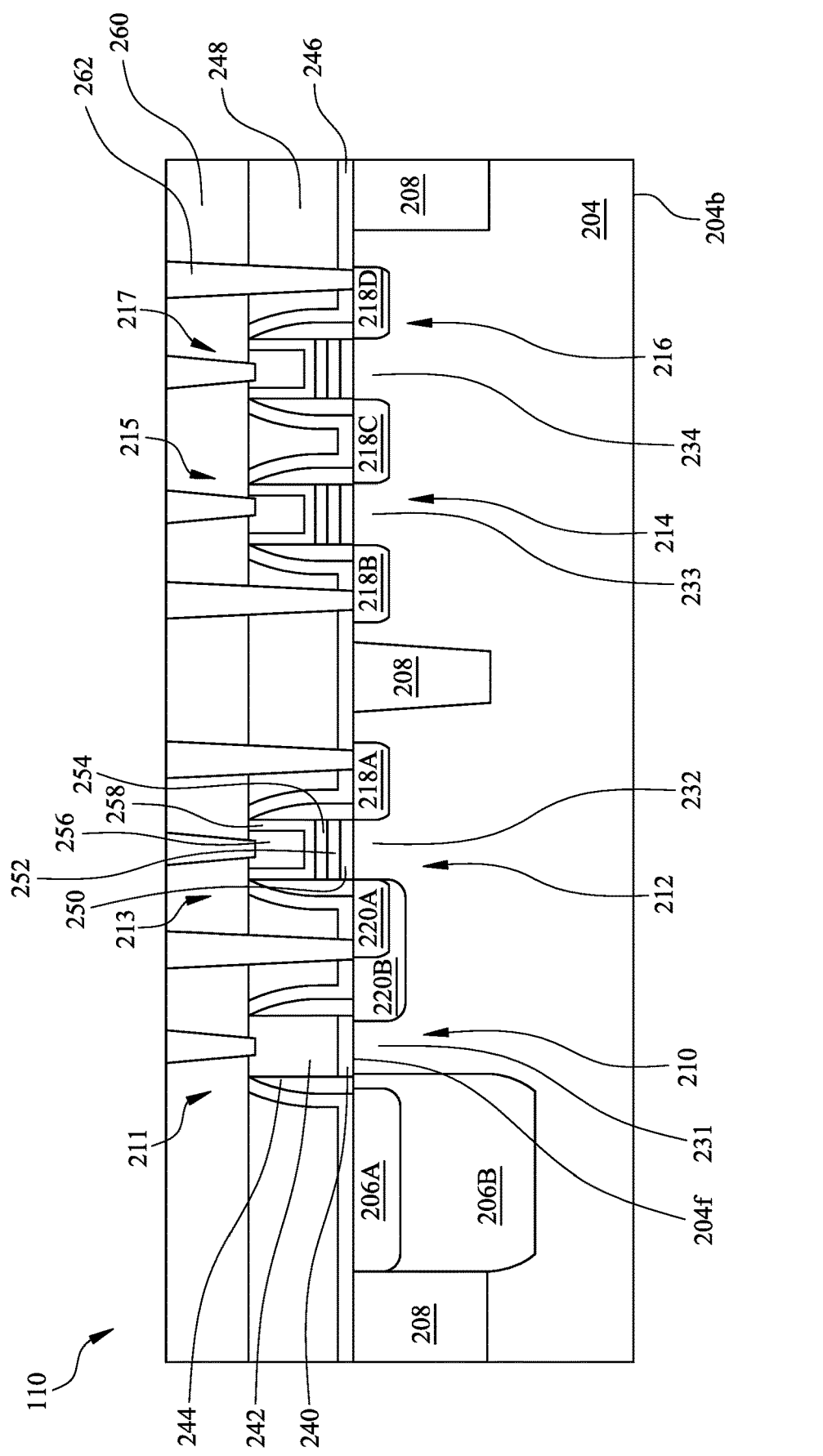
FIG. 2C is a schematic cross-sectional view of a pixel device according to embodiments of the present disclosure.

FIG. 2C is a schematic cross-sectional view of the pixel device 110 according to embodiments of the present disclosure. FIG. 2C is a cross-sectional view along the 2C-2C lines in FIG. 2A. As shown in FIG. 2C, the radiation region 206 includes a pinned layer 206A and a pinned layer 206B. The pinned layer 206A is formed along a front surface 204f of the semiconductor substrate 204. The pinned layer 206B is formed below the pinned layer 206A in the semiconductor substrate 204. A doping type of the pinned layer 206A is different from a doping type of the pinned layer 206B, and the doping type of the pinned layer 206B is different from a doping type of the semiconductor substrate 204. For example, when the semiconductor substrate 204 is a p-type doped substrate, the pinned layer 206A is a p-type doped region and the second pinned layer 206B is an n-type doped region. In some other embodiments, when the semiconductor substrate 204 is an n-type doped substrate, the pinned layer 206A is an n-type doped region and the second pinned layer 206B is a p-type doped region.

The floating diffusion region 220 includes the doped region 220A and the doped region 220B. The doped region 220B is formed between the doped region 220A and the semiconductor substrate 204. The doping type of the doped region 220A is identical to the doping type of the doped region 220B with different doping concentration, and the doping type of the doped region 220B is different from the doping type of the semiconductor substrate 204. For example, the doped region 220A is an n-typed heavily doped region, the doped region 220B is an n-type lightly doped region, and the semiconductor substrate 204 is the p-type doped substrate. The doped region 220A may be a p-typed heavily doped region, the doped region 220B may be a p-type lightly doped region, and the semiconductor substrate 204 is an n-type doped substrate.

The various transistors, such as the transfer transistor 210, the reset transistor 212, the source-follower transistor 214, and the select transistor 216 with corresponding gates are formed on the front surface 204f of the semiconductor substrate 204. The transfer gate 211 may overlay a portion of the pinned layer 206B. The transfer gate 211 may also cover a channel region 231 of the transfer transistor 210. The reset gate 213 may overlay a portion of the doped region 220A and a portion of the doped region 218A. The reset gate 213 may also cover a channel region 232 of the reset transistor 212. The source-follower gate 215 may overlay a portion of the doped region 218B and a portion of the doped region 218C, and cover a channel region 233 of the source-follower transistor 214. The select gate 217 may overlay a portion of the doped region 218C and a portion of the doped region 218D, and cover a channel region 234 of the select transistor 216.

During operation, the image sensing device 100 is designed to receive radiation traveling towards the front surface 204f or the back surface 204b of the semiconductor substrate 204. The incident radiation may be visual light. Alternatively, the incident radiation may be infrared (IR), ultraviolet (UV), X-ray, microwave, other suitable types of radiation, or a combination thereof. A lens may be positioned over the front surface 204f or the back surface 204b of the semiconductor substrate 204 to direct the incident radiation to the corresponding radiation region 206 in the semiconductor substrate 204. The incident radiation generates electron-hole pairs in the pixel device 110. When exposed to the incident radiation, the radiation region 206 responds to the incident radiation by accumulating electrons.

As shown in FIG. 2C, the various gates 211, 213, 215, 217 in the pixel device 110 are formed over the front surface 204f of the semiconductor substrate 204. The various gates 211, 213, 215, 217 may be disposed within an interlayer dielectric (ILD) layer 248. Sidewall spacers 244 may be disposed on vertical sidewalls of the gates 211, 213, 215, 217. A contact etch stop layer (CESL) 246 may be disposed between the ILD layer 248 and the sidewall spacers 244/the semiconductor substrate 204. One or more intermetal dielectric (IMD) layer 260 may be disposed over the ILD layer 248. Various conductive features 262 may be disposed in the ILD layer 248 and the IMD layer 260 to connect gates and source/drain features of the transistors 210, 212, 214, and 216.

In some embodiments, one or more of the various gates 211, 213, 215, 217 in the pixel device 110 may include a gate stack having a gate electrode layer comprising metallic material. In some embodiments, one or more of the various gates 211, 213, 215, 217 in the pixel device 110 may include a gate stack comprising a ferroelectric layer.

In some embodiments, the various gates 211, 213, 215, 217 in the pixel device 110 may include gate stacks of different compositions. It should noted that the term "composition" refers a specific arrangement of various layers in a gate stack. For example, two gate stacks have different compositions when the two gate stacks includes different material layers, and/or different line-up of material layers. For example, one or more of the various gates 211, 213, 215, 217 in the pixel device 110 may include a gate stack having a gate electrode layer comprising metal while other gates among the various gates 211, 213, 215, 217 in the pixel device 110 may include a gate electrode layer comprising polycrystalline silicon. In the embodiments of FIG. 2C, the transfer gate 211 includes a gate electrode layer comprising polycrystalline silicon, while the source-follower gate 215, the reset gate 213, and the select gate 217 include a gate stack with a gate electrode layer comprising metal. In some embodiments, at least one of the source-follower gate 215, the reset gate 213, and the select gate 217 includes a ferroelectric layer.

By using polycrystalline silicon in the transfer gate 211, the present disclosure allows the transfer gate 211 to be tuned independently from the gates in the drive circuit, such as the source-follower gate 215, the reset gate 213, and the select gate 217. The transfer gate 211 may also be shaped and/or arranged differently to improve the efficiency of the radiation region 206. For example, the transfer gate may be shaped vertically to improve device density while the gates in the drive circuits are planar. A vertical transfer gate may be formed from a deep trench that is filled with doped conductive material, lined with gate dielectric liner, and surrounded by a p-doped region. When turned on, a vertical transfer gate may function like a straw to suck out electrons along walls of the deep trench into the floating diffusion region. Vertical transfer gate structures improve the fill factor (i.e., the size) of the photodetectors, and therefore improve the quantum efficiency (QE) of the photodetectors. Because of the short process time, low defect, high yield, and low cost, doped polycrystalline silicon or silicon oxide is typically used to fill the deep trenches to form vertical transfer gate structures. Therefore, according to present disclosure, polycrystalline silicon is used in the transfer gate 211 while other gate structures are formed from different arrangement of material layers.

Figures 2D, 2E:
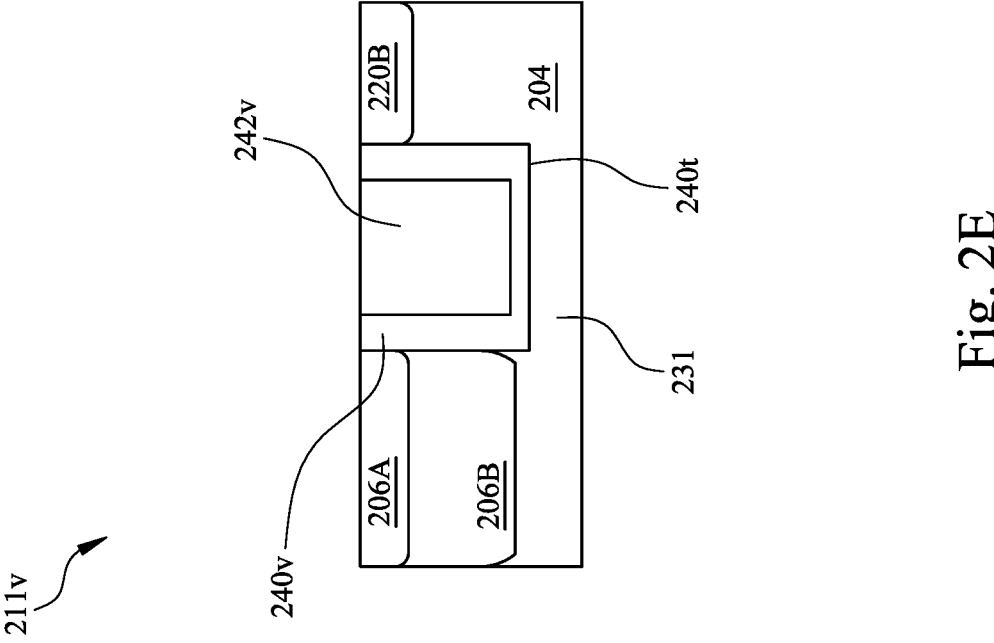
FIG. 2D is a schematic sectional view of a gate structure in the pixel device according to embodiments of the present disclosure.
FIG. 2E is a schematic sectional view of a gate structure in the pixel device according to embodiments of the present disclosure.

FIG. 2D is a schematic sectional view of a gate stack of the transfer gate 211 in FIG. 2C. The transfer gate 211 may include a gate dielectric layer 240 and gate electrode layer 242. The gate dielectric layer 240 is disposed on the front surface 204f of the semiconductor substrate 204. The gate dielectric layer 240 may be disposed on the front surface 204f at the channel region 231 and portions of the pinned layer 206A and the doped region 220B. In some embodiments, the gate dielectric layer 240 is in direct contact with the channel region 231 and portions of the pinned layer 206A and the doped region 220B. In other embodiments, an interfacial layer (not shown) may be disposed between the gate dielectric layer 240 and the front surface 204f of the substrate. The gate electrode layer 242 is disposed on the gate dielectric layer 240. In some embodiments, the gate electrode layer 242 is in contact with the gate dielectric layer 240. The gate dielectric layer 240 may include a dielectric material, such as silicon oxide, or other suitable material. In some embodiments, the gate electrode layer 242 includes polycrystalline silicon. The optional interfacial layer may include an oxide material such as silicon oxide. The interfacial layer serves as an interface between the channel region 231 and the gate dielectric layer 240 and the gate electrode layer 242.

FIG. 2E is a schematic sectional view of a vertical transfer gate structure 211v in the pixel device according to embodiments of the present disclosure. The vertical transfer gate 211v may include a gate dielectric layer 240v and gate electrode layer 242v. The gate dielectric layer 240v a deep trench 240t formed in the semiconductor substrate 204. The gate electrode layer 242t is filled in the deep trench 204t on the gate dielectric layer 240. The vertical transfer gate structure 211v has a smaller footprint, thus, allowing larger size of the pinned layers 206B and improved quantum efficiency.

Figure 2G:
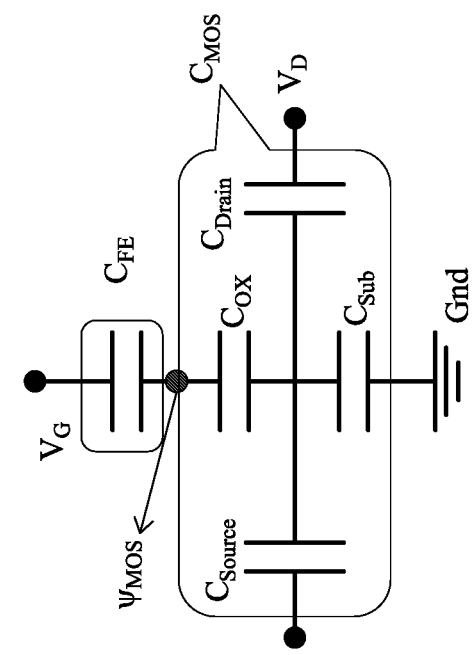
FIG. 2G is a schematic circuit diagram of the gate structure of FIG. 2F.
Figure 2F:
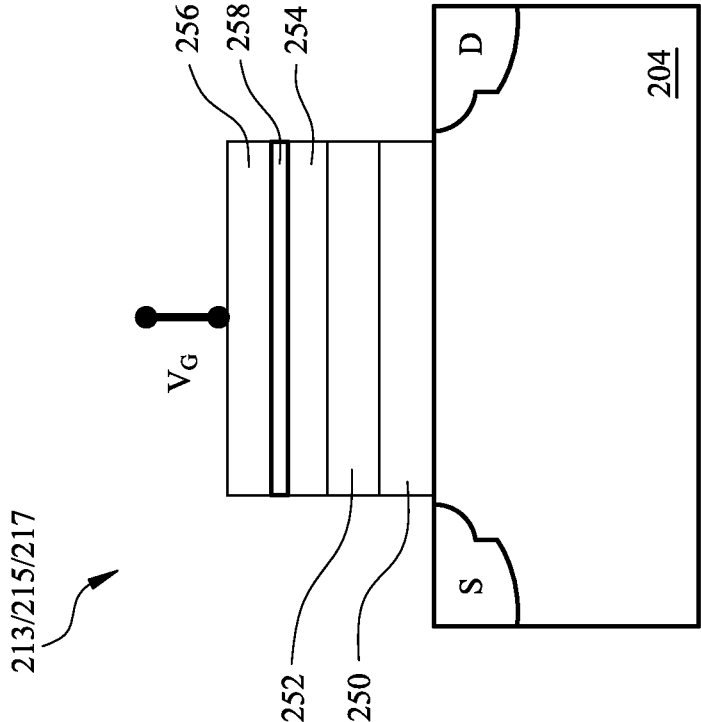
FIG. 2F is a schematic sectional view of a gate structure in the pixel device according to embodiments of the present disclosure.

FIG. 2F is a schematic sectional view of a gate stack of the gate 213/215/217 in FIG. 2C. The gate 213/215/217 may include a high-k dielectric layer 250, an inner gate electrode layer 252, a ferroelectric layer 254, and a top gate electrode layer 256. The high-k dielectric layer 250 is disposed on the front surface 204f of the semiconductor substrate 204. The high-k dielectric layer 250 may be disposed on the front surface 204f at the channel region 232/233/234 and portions of the doped regions 220A/218A/218B/218C/218D. In some embodiments, the high-k dielectric layer 250 is in direct contact with the channel region 232/233/234 and portions of the doped region 220A/218A/218C/218C/218D. In other embodiments, an interfacial layer (not shown) may be disposed between the high-k dielectric layer 250 is in direct contact with the channel region 232/233/234 and portions of the doped region 220A/218A/218C/218C/218D. The interfacial layer serves as an interface between the channel region 232/233/234 and portions of the doped region 220A/218A/218C/218C/218D.

The inner gate electrode layer 252 is disposed on the high-k dielectric layer 250. In some embodiments, the inner gate electrode layer 252 is in contact with the high-k dielectric layer 250. The ferroelectric layer 254 is disposed on the inner gate electrode layer 252. In some embodiments, the ferroelectric layer 254 is in contact with the inner gate electrode layer 252. The top gate electrode layer 256 is disposed on the ferroelectric layer 254. In some embodiments, the top gate electrode layer 256 is in contact with the ferroelectric layer 254.

In other embodiments, a work function metal layer 258 may be disposed between the ferroelectric layer 254 and the top gate electrode layer 256. In some embodiments, the work function metal layer 258 may have a U-shape cross-section and enclose the top gate electrode layer 256, as shown in FIG. 2C.

The high-k dielectric layer 250 may a material having a dielectric constant that is greater than a dielectric constant of $SiO_2$, which is approximately 3.9. In some embodiments, the k-value of the high-k dielectric layer 250 is higher than about 7. In some embodiments, the k-value of the high-k dielectric layer 250 is in a range from approximately 18 to approximately 40. In some embodiments, the high-k gate dielectric may include $HfO_2$, $Al_2O_3$, $HfSiO_y$, $La_2O_3$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or a combination thereof. In some embodiments, the high-k dielectric layer 250 may have a thickness in a range between 1 angstrom and about 10 angstroms.

The inner gate electrode layer 252 is disposed over high-k dielectric layer 250. The inner gate electrode layer 252 is a metal-containing layer in some embodiments. Furthermore, inner gate electrode layer 252 may have a low resistivity much lower than the resistivity of the underlying high-k dielectric layer 250. The inner gate electrode layer 252 includes a conductive material and functions as a gate electrode to form a high-k metal gate with the high-k dielectric layer 250. The inner gate electrode layer 252 may include conductive material having a higher melting temperature than the annealing temperature used to form the ferroelectric layer 254 subsequently. The inner gate electrode layer 252 may include TiN, TaN, tungsten (W), platinum (Pt), or the like. In some embodiments, the inner gate electrode layer 252 may have a thickness in a range between about 1 nm and about 3 nm.

The ferroelectric layer 254 is disposed over the inner gate electrode layer 252. The ferroelectric layer 254 includes electric dipoles to form a negative capacitance device between the inner gate electrode layer 252 and the top gate electrode layer 256. The thickness of the ferroelectric layer 254 may be in the range between about 1 nm and about 10 nm. In some embodiments, the thickness of the ferroelectric layer 254 may be in the range between about 3 nm and about 6 nm. The ferroelectric layer 254 may include HfZrOx, $HfO_2$, $HfSiO_x$x, $Al_2O_3$, $TiO_2$, $LaO_x$, BaSrTiOx (BST), PbZr-$TiO_x$ (PZT), or the like, wherein value x is greater than zero and smaller than 1. In some embodiments, the ferroelectric layer 254 may include $Hf_{1-x}Zr_xO_2$, wherein value x is greater than zero and smaller than 1. In some embodiments, the ferroelectric layer 254 may include more than one layers of various ferroelectric films. Capacitance of the ferroelectric layer 254 may be tuned by varying thickness and/or composition of the two or more ferroelectric films in the ferroelectric layer 254 and provide flexibility in device performance.

The top gate electrode layer 256 is disposed over the ferroelectric layer 254. The top gate electrode layer 256 may include a metallic material. For example, the top gate electrode layer 256 may include Al, W, Cu, or combinations thereof. The top gate electrode layer 256 is configured to serve as the main conductive portion of the functional gate structure. As discussed above, the work function metal layer 258 may be disposed between the top gate electrode layer 256 and the ferroelectric layer 254. The work function metal layer 258 is used to tune a work function of the corresponding transistor to achieve a desired threshold voltage Vt. In some embodiments, the work function metal component may contain: TiAl, TiAlN, TaCN, TiN, WN, or W, or combinations thereof.

FIG. 2G is a schematic circuit diagram of the gate structure of FIG. 2F. FIG. 2G is a capacitance model corresponding a portion between ground (Gnd) and a gate voltage ($V_G$) node in a MOS transistor having the gate structure of FIG. 2F. A capacitance of the MOS transistor is denoted as $C_{MOS}$, which is a combination of a gate oxide capacitance Cox, a depletion region capacitance $C_{Sub}$, a source region capacitance $C_{source}$, and a drain region capacitance $C_{Drain}$. Cox may be determined by the material compositions and/or the thicknesses of the interfacial layer, if present, and the high-k dielectric layer 250, and $C_{Sub}$ may be determined by the process conditions and designs of the source/drain regions, such as the doped regions 220A, 218A-D, and the channel region, such as the channel region 232, 233, 234. The capacitance model further includes $C_{FE}$, which represents a capacitance of the ferroelectric layer 254. $C_{FE}$ may be determined by the material composition and/or the thickness of the ferroelectric layer 254. When the ferroelectric layer 254 includes two or more ferroelectric films, $C_{FE}$ may be a result of two or more capacitors connected in series.

$C_{FE}$ has a negative capacitance value because a ferroelectric film in a gate stack in a field effect transistor (FET) forms a negative capacitance device. As a result, the presence of $C_{FE}$ lowers subthreshold swing (SS) of the corresponding transistor as shown in the following equations. The SS value of a transistor, such as the transistors 212, 214, 216 in FIG. 2C, may by presented as follows:

$$SS = \left[ \frac{\partial V_G}{\partial(\log_{10} I_D)} \right] = \left[ \left( \frac{\partial V_G}{\partial \Psi_{MOS}} \right) \left( \frac{\partial \Psi_{MOS}}{\partial(\log_{10} I_D)} \right) \right] = m \times n$$

Wherein $\psi_{MOS}$ is the surface potential of the semiconductor substrate, such as the semiconductor substrate 204, wherein the transistor is formed, and $I_D$ is the drain current. The value of m is affected by the ferroelectric capacitance $C_{FE}$:

$$m = \left( \frac{\partial V_G}{\partial \Psi_{MOS}} \right) = 1 + \frac{C_{MOS}}{C_{FE}}$$

Because $C_{FE}$ has a negative value, m<1. When m<1, the corresponding transistor may function in the as Landau FET. The SS is reduced due to the existence of the ferroelectric layer 254:

$$\text{when } |C_{FE}| < C_{MOS}, SS < \frac{60 \text{ mV}}{\text{decade}}.$$

The ferroelectric layer 254 provides various advantages to the corresponding transistor, such as reducing the SS value to below 60 mV/decade, reducing threshold voltage shift, and/or gain improvement.

In the example of the source-follower transistor 214, when the source-follower gate 215 includes the ferroelectric layer 254, the threshold voltage shift can be reduced, thus, lowering power consumption. Additionally, the gate gain of the source-follower transistor 214 may improve from a range in between about 0.90 to about 0.99, compared to the gate gain value of about 0.8 for source-followers without a ferroelectric film in the gate stack.

Figure 3A:
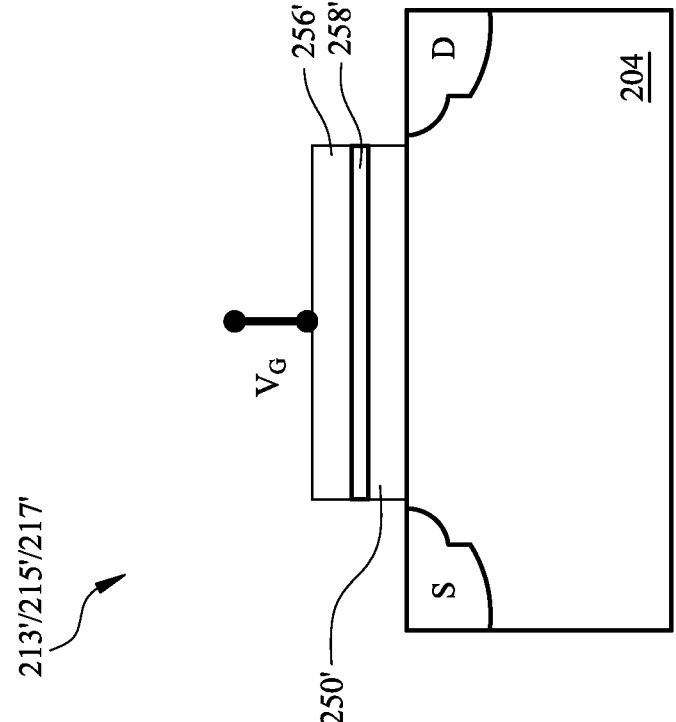
FIG. 3A is a schematic sectional view of a gate structure in the pixel device according to embodiments of the present disclosure.

In some embodiments, the various gates 211, 213, 215, 217 in the pixel device 110 may include a high-k metal gate without ferroelectric films. FIG. 3A is a schematic sectional view of a high-k metal gate without ferroelectric films. In FIG. 3A, gates 213'/215'/217' include a high-k dielectric layer 250' and a gate electrode layer 256'. The high-k dielectric layer 250' is disposed on the front surface 204$f$ of the semiconductor substrate 204. The high-k dielectric layer 250' is similar to the high-k dielectric layer 250 in FIG. 2D. The gate electrode layer 256' is disposed over the high-k dielectric layer 250'. The gate electrode layer 256' may include a metallic material. For example, the gate electrode layer 256' may include Al, W, Cu, or combinations thereof. The gate electrode layer 256' is configured to serve as the main conductive portion of the functional gate structure. As discussed above, the work function metal layer 258' may be disposed between top gate electrode 256' and the high-k dielectric layer 250'. The work function metal layer 258' is used to tune a work function of the corresponding transistor to achieve a desired threshold voltage Vt. In some embodiments, the work function metal component may contain: TiAl, TiAlN, TaCN, TiN, WN, or W, or combinations thereof.

Figure 3B:
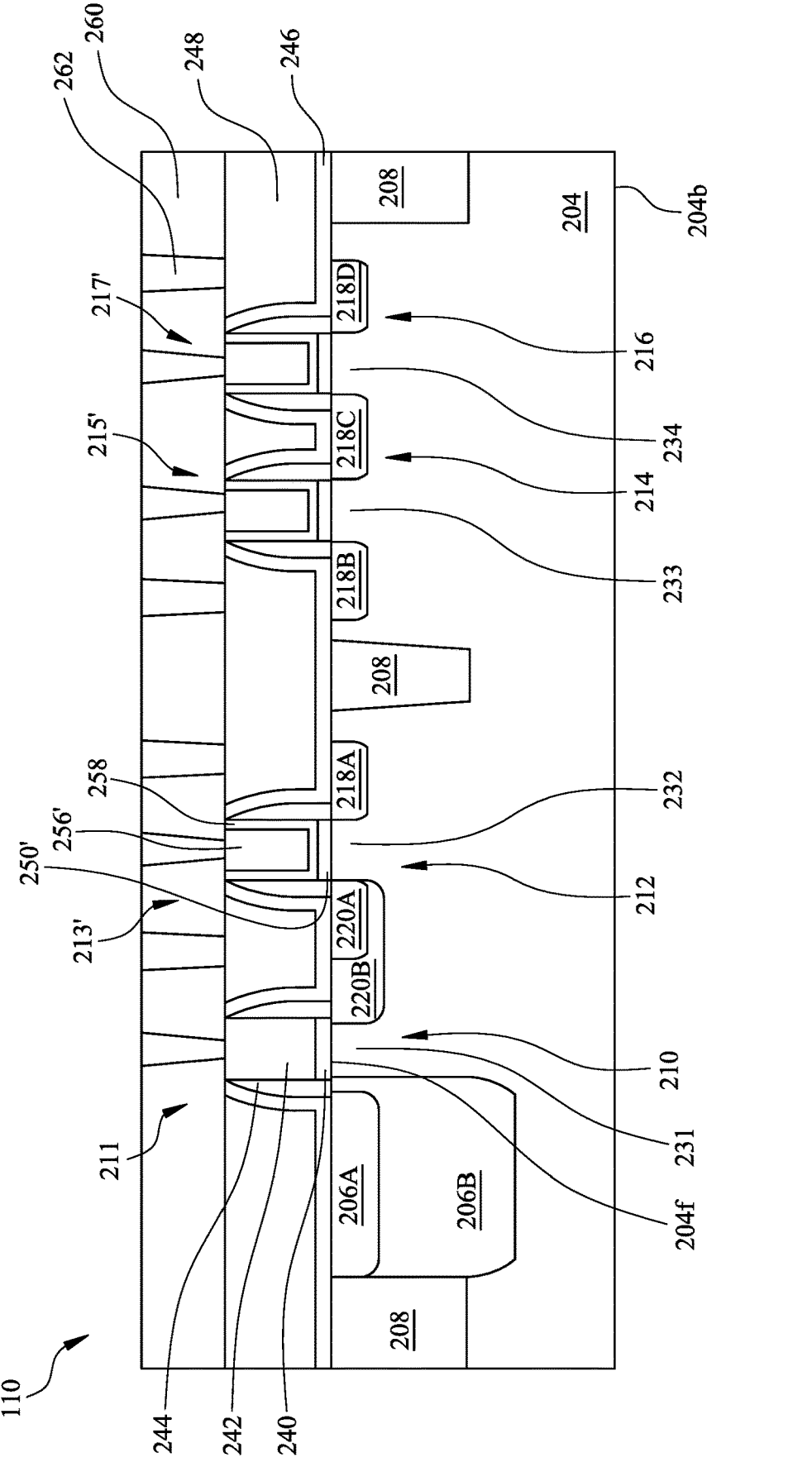
FIG. 3B is a schematic cross-sectional view of a pixel device according to embodiments of the present disclosure.

FIG. 3B is a schematic cross-sectional view of a pixel device 110' according to embodiments of the present disclosure. The pixel device 110' is similar to the pixel device 110 except that the pixel device 110' includes high-k metal gates 213'/215'/217', which do not include a ferroelectric layer. The pixel device 110' includes the transfer gate 211 with the gate electrode layer comprising polysilicon crystalline material, and the gates 213'/215'/217' including high-k metal gates. The combination of gate structures with different compositions provide flexibility in tuning various transistors, and thus improving performance. On the one hand, the high-k metal gate structures in the gates 213'/215'/217' improves speed and gain in the drive circuit, one the other hand, the polycrystalline silicon gate structure in the transfer gate 211 allows the transfer gate to have desirable shapes and arrangement.

It should be noted that the gate structures in FIGS. 2D, 2F, and 3A may be arrange in any suitable combination in a pixel devices to achieve desirable performance in an imaging sensing device according to the present disclosure.

FIG. 4 is a flow chart of a method 400 for manufacturing an image sensing device, such as the image sensing device

100 according to embodiments of the present disclosure. The method 400 can be used to from any image sensing device including both metal gate structures in a pixel device. FIGS. 5A-5L schematically illustrate various stages of manufacturing the pixel device 110 of an image sensing device according to embodiments of the present disclosure. The pixel device 110 may formed used with the method 400.

Figure 5A:
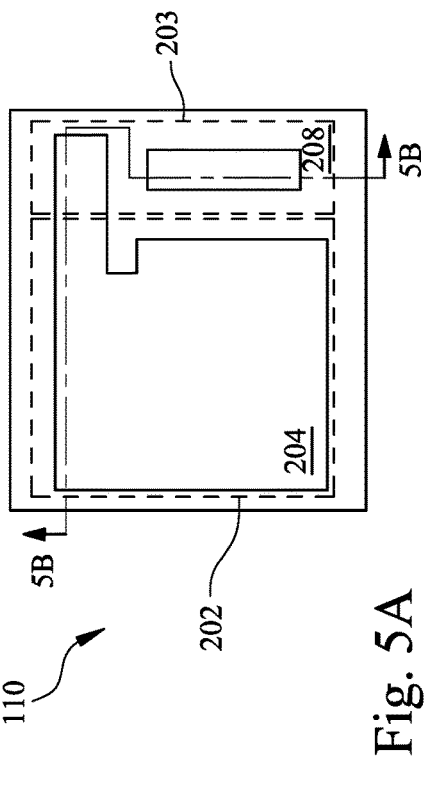
FIGS. 5A-5M schematically illustrate various stages of manufacturing an image sensing device according to embodiments of the present disclosure.
Figure 5B:
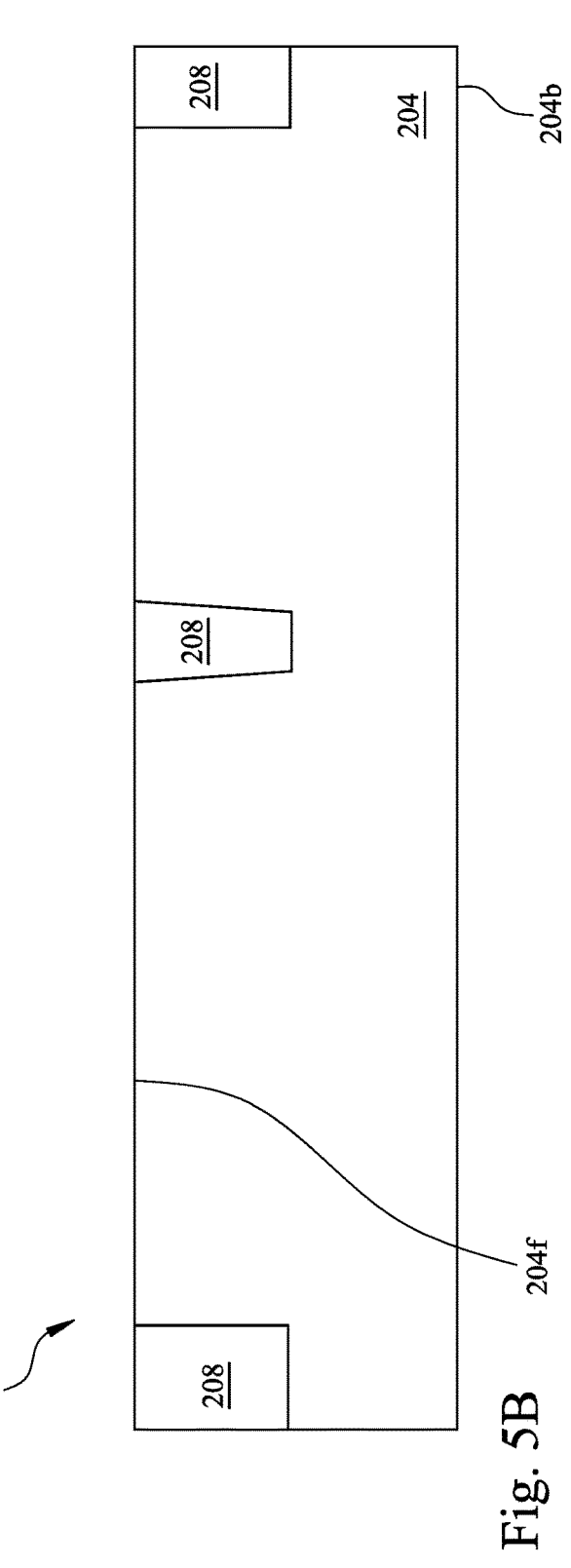

In operation 402 of the method 400, one or more pixel devices are formed in a semiconductor substrate as shown in FIGS. 5A and 5B. FIG. 5A is a schematic top view of the pixel device 110. FIG. 5B is a schematic cross-sectional view of the pixel device 110 along the line 5B-5B in FIG. 5A. Referring to FIGS. 5A-5B, the semiconductor substrate 204 in provided. The isolation structures 208 are formed on the front surface 204$f$ of the semiconductor substrate 204 to define one or more pixel devices 110.

The semiconductor substrate 204 may comprise any type of semiconductor body, for example, silicon/CMOS bulk, SiGe, SOI, etc. In some embodiment, the semiconductor substrate 204 may be prepared including forming an epitaxial layer having a first doping type (e.g. p-type) doping concentration in a range of from about $10^{13}$/cm³ to about $10^{15}$/cm³. P-type dopants may include boron, gallium, indium, other suitable p-type dopants, or a combination thereof. The semiconductor substrate 204 may alternatively be an n-type doped substrate. N-type dopants, with which the semiconductor substrate 204 is doped, include phosphorus, arsenic, other suitable n-type dopants, or a combination thereof. Doping may be implemented with a process such as ion implantation or diffusion, using various operations and techniques. In the following examples, a p-type doped substrate is taken as an example of the semiconductor substrate 204 for explanation.

The isolation structure 208 may be shallow trench isolation (STI) formed from the front surface 204$f$ of the semiconductor substrate 204. The isolation structure 208 may be formed by performing an etching process to form a shallow trench ring at peripheral regions of the pixel device 110 of the CMOS image sensor. Then a dielectric layer is filled into the shallow trench ring and over the semiconductor substrate 204 followed by an etching back process or a planarization process to expose the front surface 204$f$ of the semiconductor substrate 204. The isolation structure 208 may be formed by a high-density plasma chemical vapor deposition (HDP-CVD), a flowable CVD (FCVD), or other suitable deposition process. In some embodiments, the isolation structure 208 may include silicon oxide, silicon nitride, silicon oxynitride, fluorine-doped silicate glass (FSG), a low-k dielectric, combinations thereof.

In some embodiments, the isolation structure 208 may isolate a sensing region 202 and a drive circuit region 203. Subsequently, a photodetector, such as a photodiode, may be formed in the sensing region 202 and transistors for the driving circuit for the photodetector.

Figures 5C, 5D:
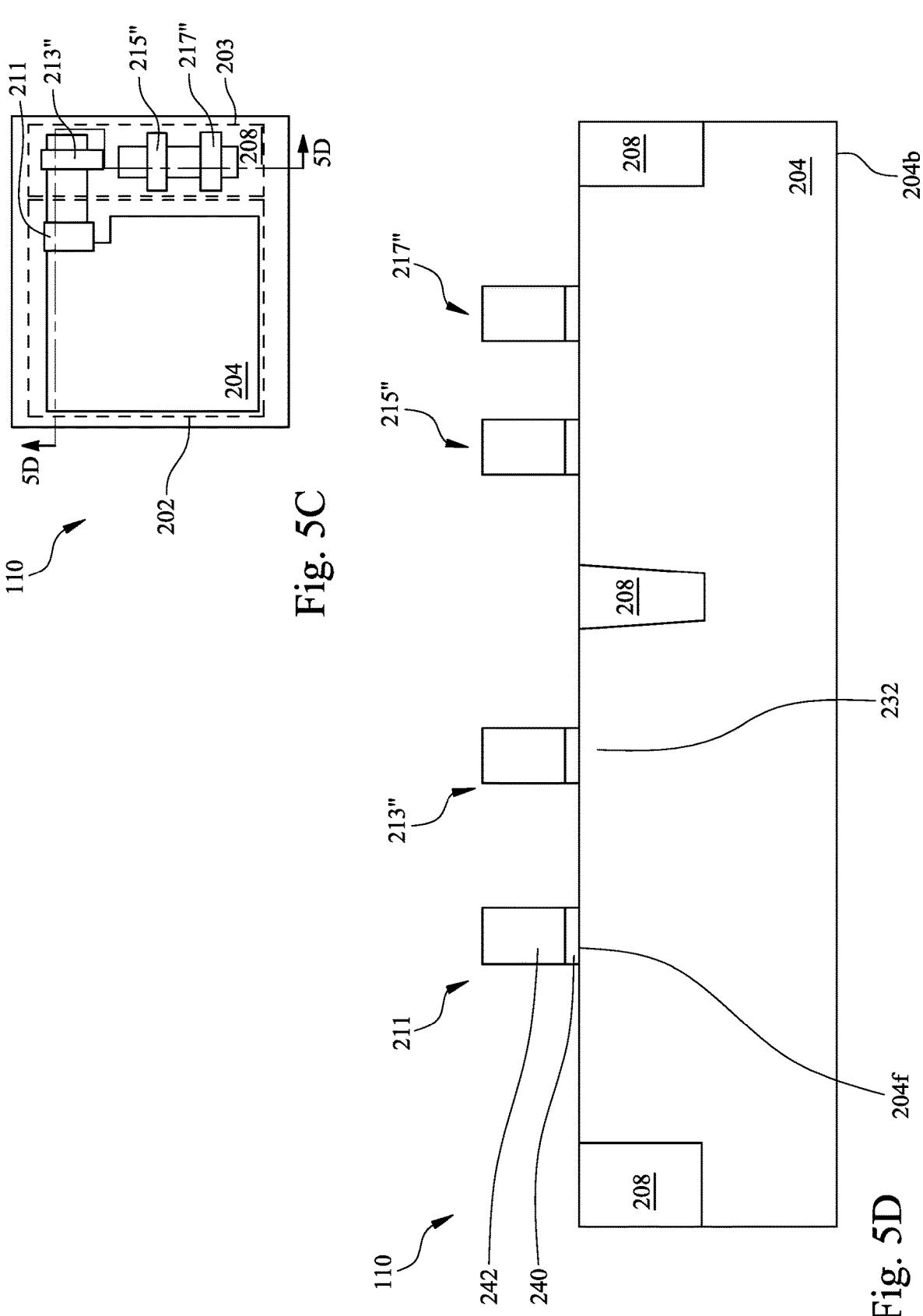
Figure 5E:
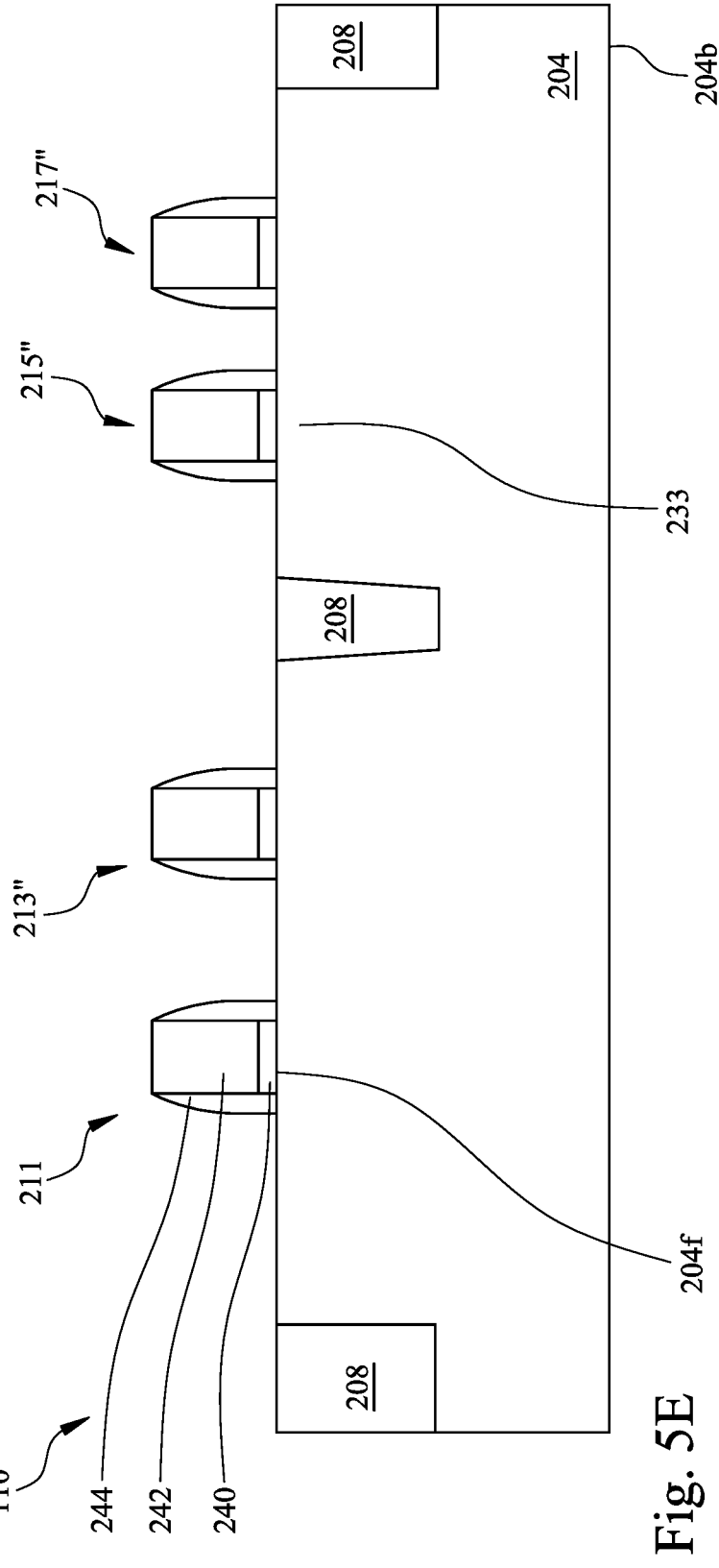

In operation 404 of the method 400, first gate structures are formed on the semiconductor substrate as shown in FIGS. 5C, 5D, and 5E. FIG. 5C is a schematic top view of the pixel device 110. FIGS. 5D-5E are schematic cross-sectional views of the pixel device 110 along the line 5D-5D in FIG. 5C.

As shown FIGS. 5C and 5D, the gates 211, 213", 215", and 217" are formed on the semiconductor substrate 204 in the pixel device 110. Each of the gate 211, 213", 215", and 217" includes the gate dielectric layer 240 and the gate electrode layer 242. During processing, the gate dielectric layer 240 may be first deposited on the front surface 204$f$ of the semiconductor substrate 204. The gate dielectric layer 240 may include $SiO_2$, or other suitable dielectric material. In some embodiments, the gate dielectric layer 240 may be formed by CVD is used. The gate dielectric layer 240 may have a thickness in a range between about 1 nm and about 5 nm.

The gate electrode layer 242 is deposited on the gate dielectric layer 240. The gate electrode layer 242 may include polycrystalline silicon. The gate electrode layer 242 may be deposited using CVD, including LPCVD and PECVD, PVD, ALD, or other suitable process.

A patterning process and one or more etch processes are then performed to etch through the gate dielectric layer 240 and the gate electrode layer 242 to form the gates 211, 213", 215", and 217" to overlay with exposed portions of the semiconductor substrate 204 in the pixel device 110. The gates 211, 213", 215", and 217" have a first composition. Particularly, each of the gates 211, 213", 215", and 217" includes the gate electrode layer 242 comprising polycrystalline silicon. In other words, the gates 211, 213", 215", and 217" are commonly referred to as poly-gates.

After formation of the gates 211, 213", 215", and 217", the sidewall spacers 244 are formed on sidewalls of the gates 211, 213", 215", and 217", as shown in FIG. 5E. The sidewall spacers 244 may be formed by a blanket deposition one or more layers of dielectric materials, and followed by one or more anisotropic etching processes to remove the dielectric materials from horizontal surfaces. The sidewall spacers 244 may have a thickness in a range between about 2 nm and about 10 nm. In some embodiments, the sidewall spacers 244 may include one or more silicon nitride-based material, such as SiN, SiON, SiOCN or SiCN and combinations thereof.

Figures 5F, 5G:
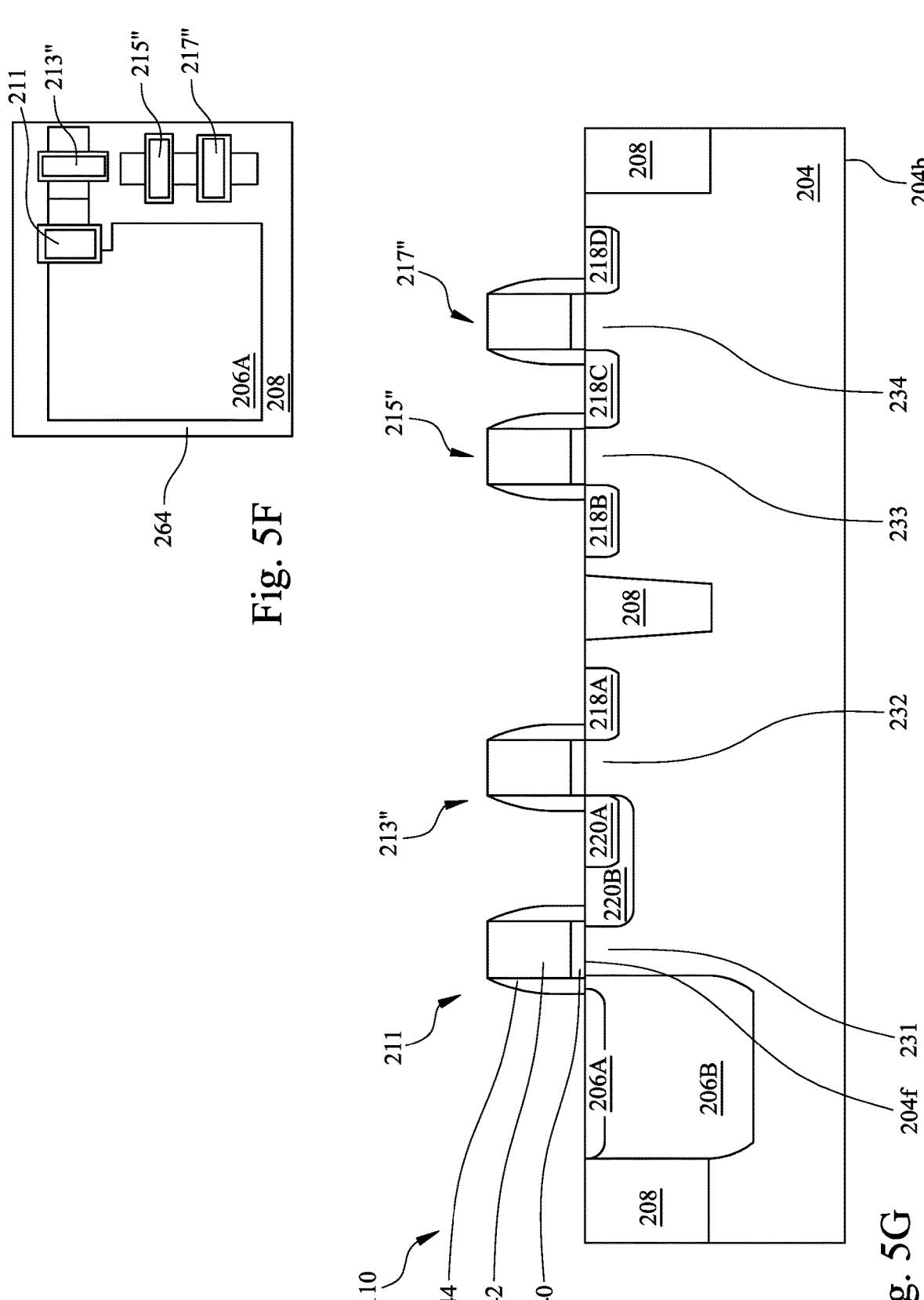

In operation 406 of the method 400, doping processes are performed to form doped regions in the semiconductor substrate 204, as shown in FIGS. 5F and 5G. FIG. 5F is a schematic top view of the pixel device 110. FIG. 5G is schematic cross-sectional view of the pixel device 110 along the line 5D-5D in FIG. 5C.

As shown in FIG. 5F, the radiation region 206, the floating diffusion region 220, and the doped regions 218A-218D are formed in the semiconductor substrate 204 in the pixel device 110. In some embodiments, the radiation region 206 includes the pinned layer 206A and the pinned layer 206B, the floating diffusion region 220 includes the doped region 220A and the doped region 220B. In some embodiments, the pinned layer 206B, the doped region 220B, and the doped regions 218A-218D may be first formed in the semiconductor substrate 204 in one or more ion implantation or diffusion processes. The pinned layer 206A is formed on the pinned layer 206B and is partially surrounded by the pinned layer 206B. The doped region 220A is formed in the doped region 220B. A doping type of the pinned layer 206A is different from a doping type of the pinned layer 206B, and the doping type of the pinned layer 206B is different from a doping type of the semiconductor substrate 204. For example, the pinned layer 206A is a p-type doped region, the pinned layer 206B is an n-type doped region, and the semiconductor substrate 204 is a p-typed doped substrate. The doping type of the doped region 220A is identical to the doping type of the doped region 220B, and the doping type of the doped region 220B is different from the doping type of the semiconductor substrate 204. For example, the doped region 220A is an n-typed heavily doped region, the doped region 220B is an n-type lightly doped region, and the semiconductor substrate 204 is a p-type doped substrate.

Figure 5H:
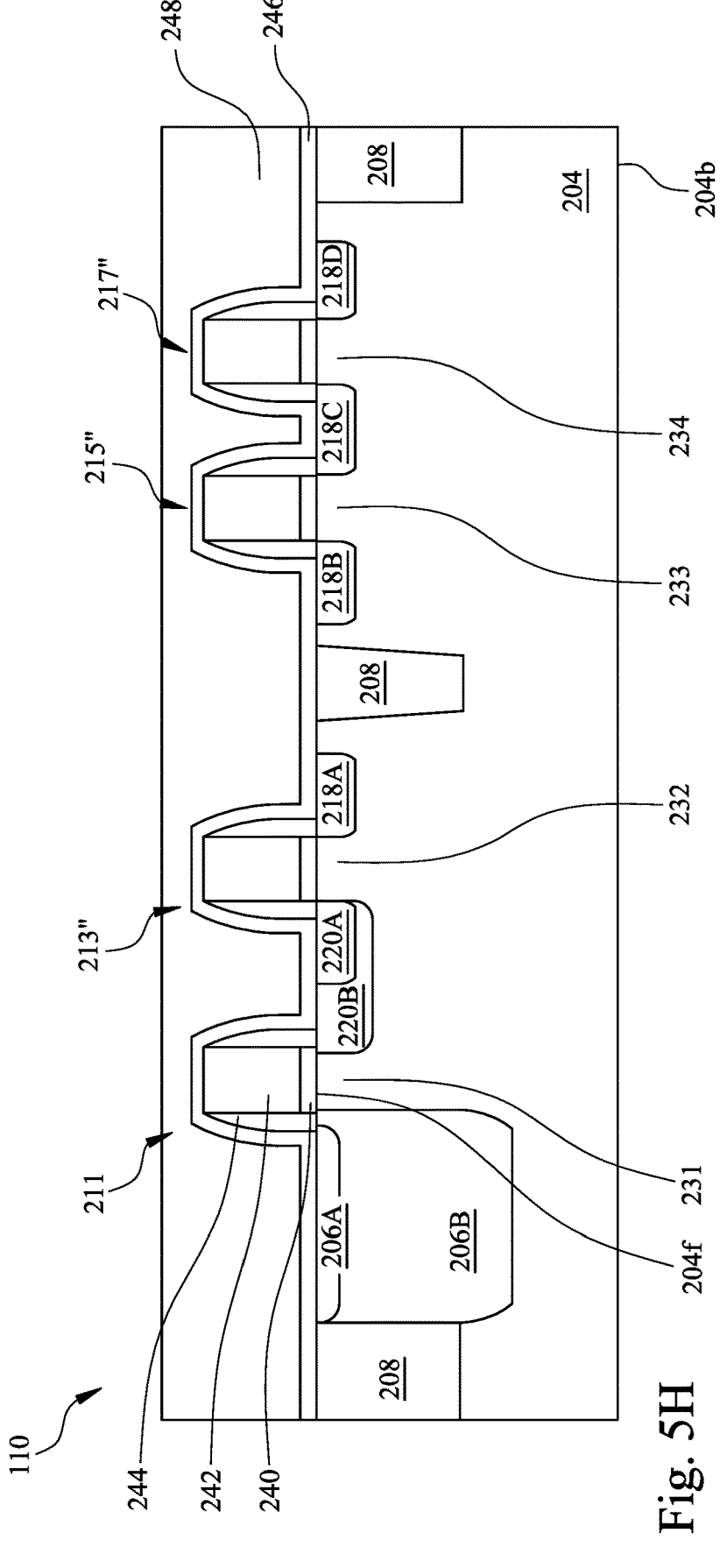

In operation 408 of the method 400, the CESL layer 246 and the ILD layer 248, as shown in FIG. 5H. FIG. 5H is schematic cross-sectional view of the pixel device 110 along the line 5D-5D in FIG. 5C.

After the doping process in operation 406, the CESL layer 246 is form by a blanket deposition to cover exposed surfaces of the radiation region 206, the floating diffusion region 220, and the doped regions 218A-218D. The CESL layer 246 acts as an etch stop and provides protection to the doped regions during the subsequent processes to form contact features. The CESL layer 246 may include $Si_3N_4$, SiON, SiCN or any other suitable material, and may be formed by CVD, PVD, or ALD.

The ILD layer 248 is then deposited over the CESL layer 246. The ILD layer 248 may include one or more layers of suitable layers of dielectric materials, such as silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, other suitable materials, or a combination thereof. The ILD layer 248 may be formed by a suitable deposition process, such as CVD, and ALD. A planarization operation, such as CMP, is performed to expose the gate electrode layer 242 for subsequent replacement gate process sequence.

Figures 5I, 5J:
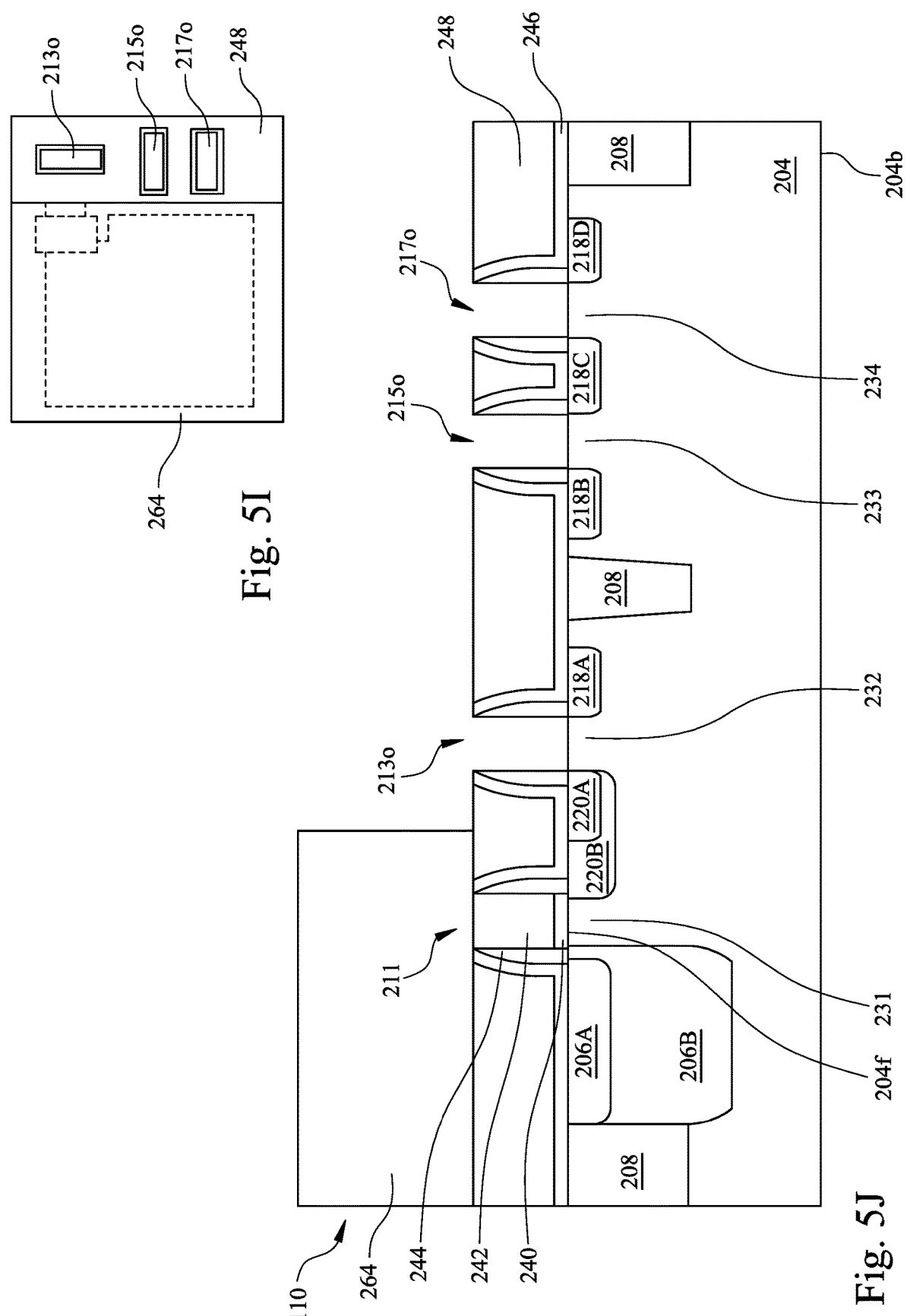
Figure 5K:
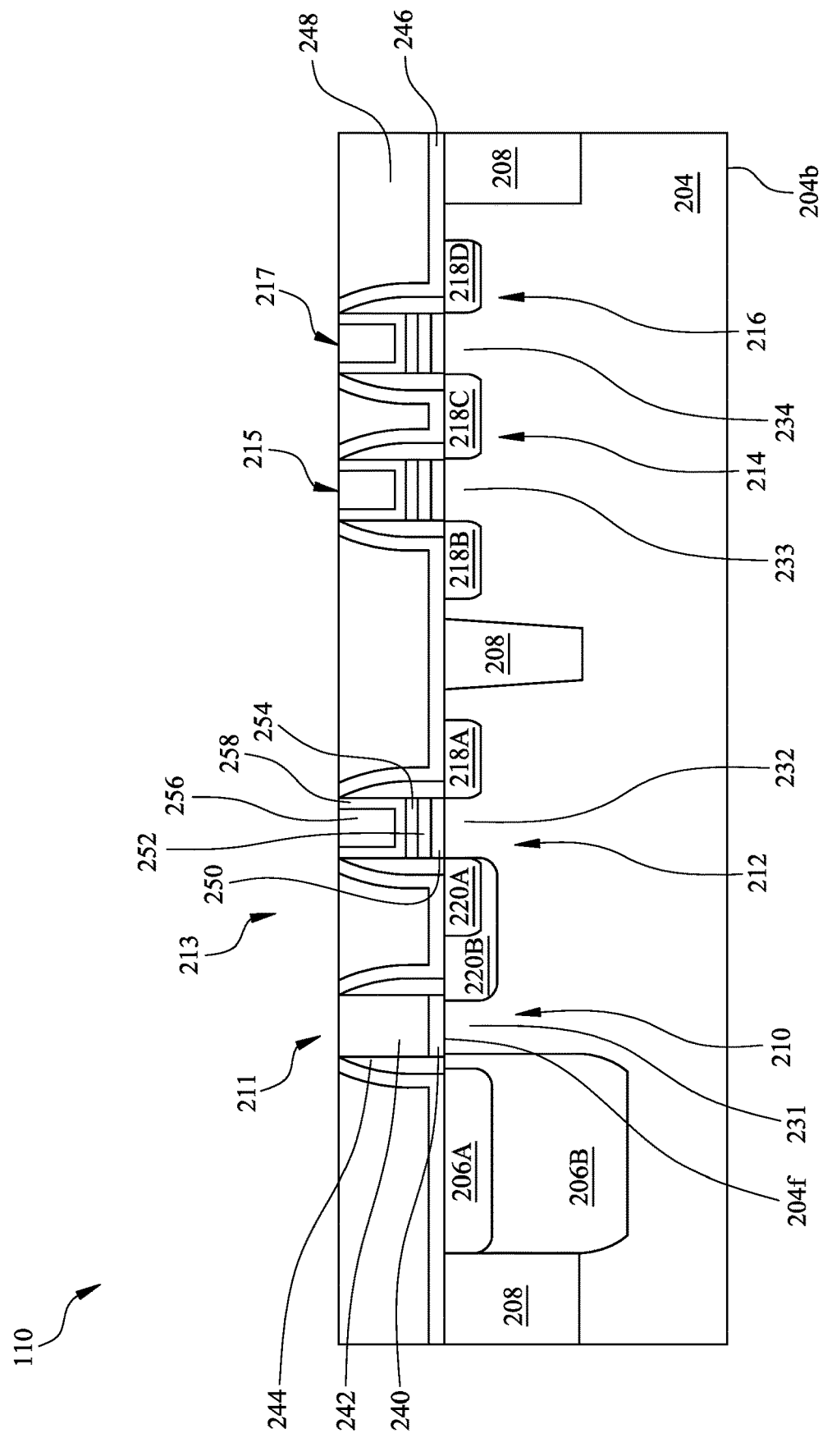

In operations 410 and 412 of the method 400, a replacement gate process sequence is performed to replace at least one of the gates 211, 213", 215", and 217", which includes a polycrystalline silicon gate electrode, is replaced with a gate structure comprising a metallic gate electrode layer, as shown in FIGS. 5I, 5J, and 5K.

In operation 410, a patterning process is performed to expose and remove a portion of the first gate structures, as shown in FIGS. 5I and 5J. FIG. 5I is a schematic top view of the pixel device 110. FIG. 5J is schematic cross-sectional view of the pixel device 110 along the line 5D-5D in FIG. 5C. In some embodiments, a photolithograph process may be performed so that a portion of the gates 211, 213", 215", and 217" in each pixel device 110 is covered by a patterned photoresist layer 264. In FIGS. 5I and 5J, the patterned photoresist layer 264 covers the transfer gate 211 and exposes the gates 213", 215", and 217". The photoresist layer 264 may be patterned differently to cover and expose selected gates according to circuit design. For example, the patterned photoresist layer 264 may expose the gates in the drive circuit region 203 and cover the gates in the sensing region 202. In other embodiments, the patterned photoresist layer 264 exposes the gate corresponding to the source-follower transistor 214 and covers the remaining transistors.

After the patterning process, one or more etching processes is performed to remove the gate stack in the exposed gate structure and forms gate trenches 213o, 215o, and 217o. The gate structures can be removed using plasma dry etching and/or wet etching. In some embodiments, the polycrystalline silicon contacting gate electrode layer 242 may be selective removed using a wet etchant. For example, a Tetramethylammonium hydroxide (TMAH) solution can be used to selectively remove the gate electrode layer 242 without removing the dielectric materials of the ILD layer 248, the CESL layer 246, and the sidewall spacers 244. The gate dielectric layer 240 is thereafter removed using plasma dry etching and/or wet etching. As shown in FIGS. 5I and 5J, after the gate electrode layer 242 and the gate dielectric layer 240 are removed, the front surface 204f of the semiconductor substrate 204 is exposed at bottoms of the trenches 213o, 215o, and 217o.

In operation 412, gate structures of a second composition are formed, as shown in FIG. 5K. FIG. 5K is schematic cross-sectional view of the pixel device 110 along the line 5D-5D in FIG. 5C. In FIG. 5K, replacement gates 213, 215, and 217 are formed in place of the gates 213", 215", and 217" respectively. The gates 213, 215, and 217 may be high-k metal gate. In some embodiments, the gates 213, 215, and 217 may include the high-k dielectric layer 250, the inner gate electrode layer 252, the ferroelectric layer 254, and the top gate electrode layer 256 sequentially formed in the trenches 213o, 215o, and 217o.

The high-k dielectric layer 250 may be formed by depositing one or more layers of high-k material, such as $HfO_2$, $Al_2O_3$, $HfSiO_y$, $La_2O_3$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or a combination thereof, using ALD, PECVD, or the like.

The inner gate electrode layer 252 is then disposed over the high-k dielectric layer 250. The inner gate electrode layer 252 may be formed by depositing one or more conductive material, such as TiN, TaN, tungsten (W), platinum (Pt), or the like, using a suitable deposition process, such as PVD.

The ferroelectric layer 254 is the deposited on the inner gate electrode layer 252 by a suitable deposition process, such as ALD, CVD, PECVD, MOCVD, or PVD. In some embodiments, the ferroelectric layer 254 may be deposited by an ALD process to achieve desired thickness and a material composition. In some embodiments, the thickness of the ferroelectric layer 254 may be in the range between about 3 nm and about 6 nm to achieve a negative capacitance. In some embodiments, the ferroelectric layer 254 may be deposited at a temperature to facilitate the formation of the ferroelectric property in the ferroelectric layer 254, for example in a temperature range between about 200 degrees Celsius and about 400 degrees Celsius The material composition of the ferroelectric layer 254 may be configured to achieve a desired tuning range for a negative capacitance. In some embodiments, the ferroelectric layer 254 includes a doped hafnium zirconium oxide material composition. The ferroelectric layer 254 may include hafnium oxide that is doped with a zirconium dopant. In some embodiments, the concentration of the zirconium dopant is in a range between about 20% and about 70%, for example between about 45% and about 55%. In some embodiments, the concentration may be measured in terms of molar mass. For example, the percentage of the dopant concentration may be expressed as a mole fraction or a molar fraction. This dopant concentration level range helps to optimize the capacitance tuning properties of the ferroelectric layer 254.

In other embodiments, the ferroelectric layer 254 may other materials, such as hafnium silicon oxide, hafnium aluminum oxide, or barium titanium oxide. The ferroelectric layer 254 may include other dopants, such as silicon (Si), aluminum (Al), lead (Pb), barium (Ba), or titanium (Ti). In some embodiments, the ferroelectric layer 254 may be formed by a PVD process followed by an anneal process. In some embodiments, the ferroelectric layer 254 may be formed using PVD at a wafer temperature between about 25° C. and about 400° C. In some embodiments, the ferroelectric layer 254 includes $HfSiO_x$, having an atomic percentage ratio $P_{Hf}/P_{si}$ greater than about 10, and may be in the range between about 10 and about 100. An anneal process may be performed to achieve ferroelectric property in the PVD film. The annealing may be performed using thermal annealing, microwave annealing, laser annealing, or other applicable methods. The annealing duration may be shorter than about 1,000 seconds. The annealing temperature may be performed in a temperature range between about 400° C. and about 1,000° C. The annealing treatment, the ferroelectric layer 254 may achieve proper crystalline phase for ferroelectric property. In some embodiments, the annealing treatment may be performed after the top gate electrode layer 256.

The top gate electrode layer 256 is deposited over the ferroelectric layer 254. The top gate electrode layer 256 may include a metallic material. The top gate electrode layer 256 may be formed by any suitable process, such as CVD, ALD, PVD, or a combination. Optionally, the work function metal layer 258 may be formed between the top gate electrode layer 256 and the ferroelectric layer 254. The work function metal layer 258 may include TiAl, TiAlN, TaCN, TiN, WN, or W, or combinations thereof, by a suitable deposition process, such as PVD.

Figure 5L:
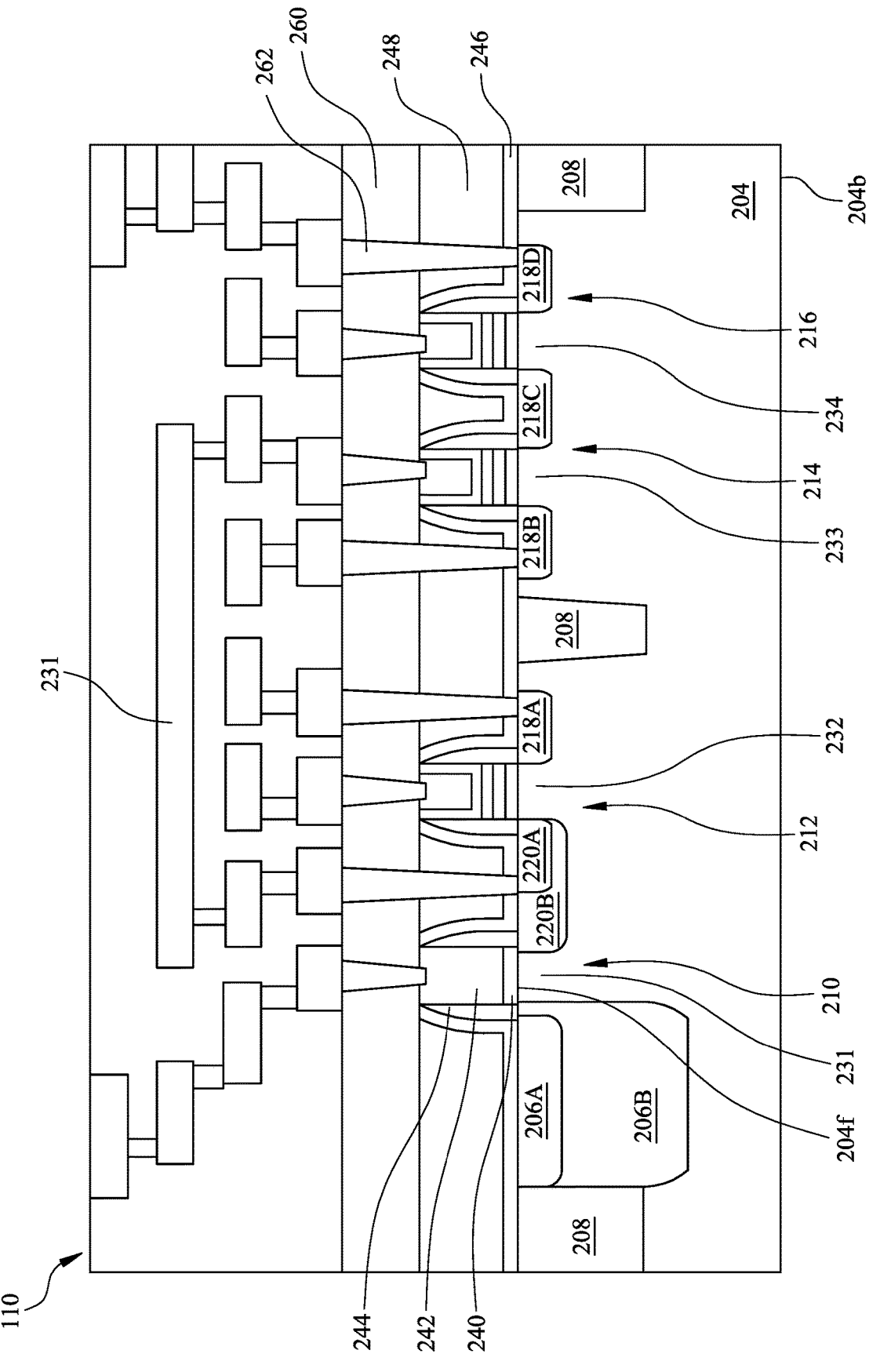
Figure 5M:
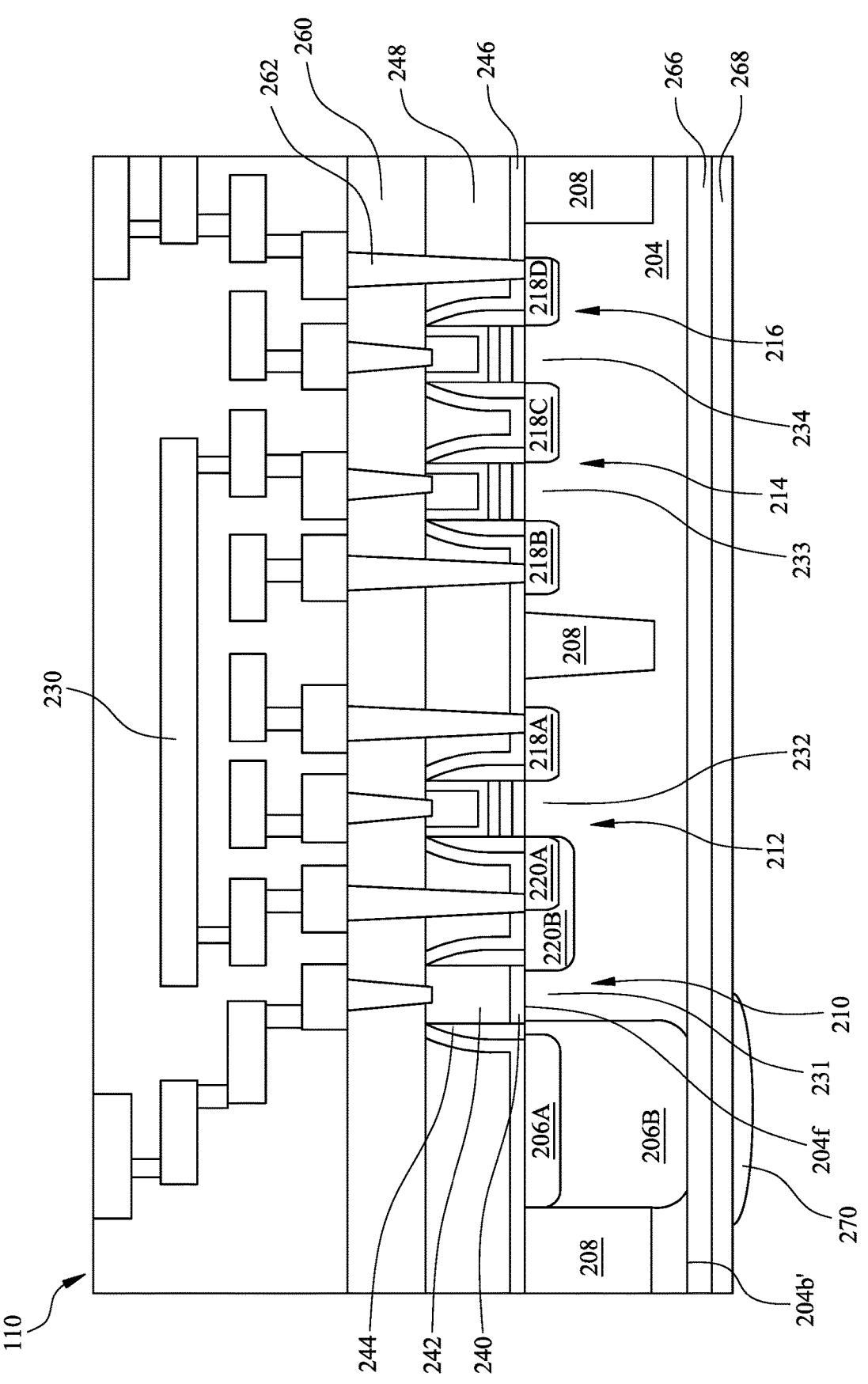

In operation 414 of the method 400, the conductive features 262 are formed in one or more IMD layers 260 to connect gates and source/drain of the transistors 210, 212, 214, and 216 with power supplies, signal lines, output, and each other, as shown in FIG. 5L. The conductive features 262 and the IMD layers 260 are sometimes referred to as an interconnect structure. The conductive features 262 may be lines and vias formed from one or more conductive materials such as aluminum, copper, titanium, titanium nitride, tungsten, polysilicon, metal silicide, other applicable materials, or a combination thereof. The IMD layers 260 includes dielectric materials, such as silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, other suitable materials, or a combination thereof. The conductive features 262 may be formed by patterning the IMD layers 260 to form trenches and vias, and then filling the trenches and vias with suitable methods.

In operation 416 of the method 400, a color filter layer 268 and a lens 270, as shown in FIG. 5K. In some embodiments, the semiconductor substrate 204 may be flipped over to attach the color filter layer 268 and the lens 270 to the back surface 204b of the semiconductor substrate 204. In some embodiment, the semiconductor substrate 204 is thinned down to expose the pinned layer 206B. An anti-reflection layer 266 may be formed on the backside 204b' of the semiconductor substrate 204. The color filter layer 268 and lens 270 are formed thereon.

In the examples above, the pixel devices 110 include 4 transistors, are referred to as 4T active pixel sensor (APS). However, other designs of pixel devices may be used, such as 3T APS, and 5T APS. Gates in the transistors in the pixel devices may include different arrangements of polycrystalline silicon gates, high-k metal gates, and ferroelectric high-k metal gates to achieve desired performance, or convenient manufacturing procedure.

Figure 6B:
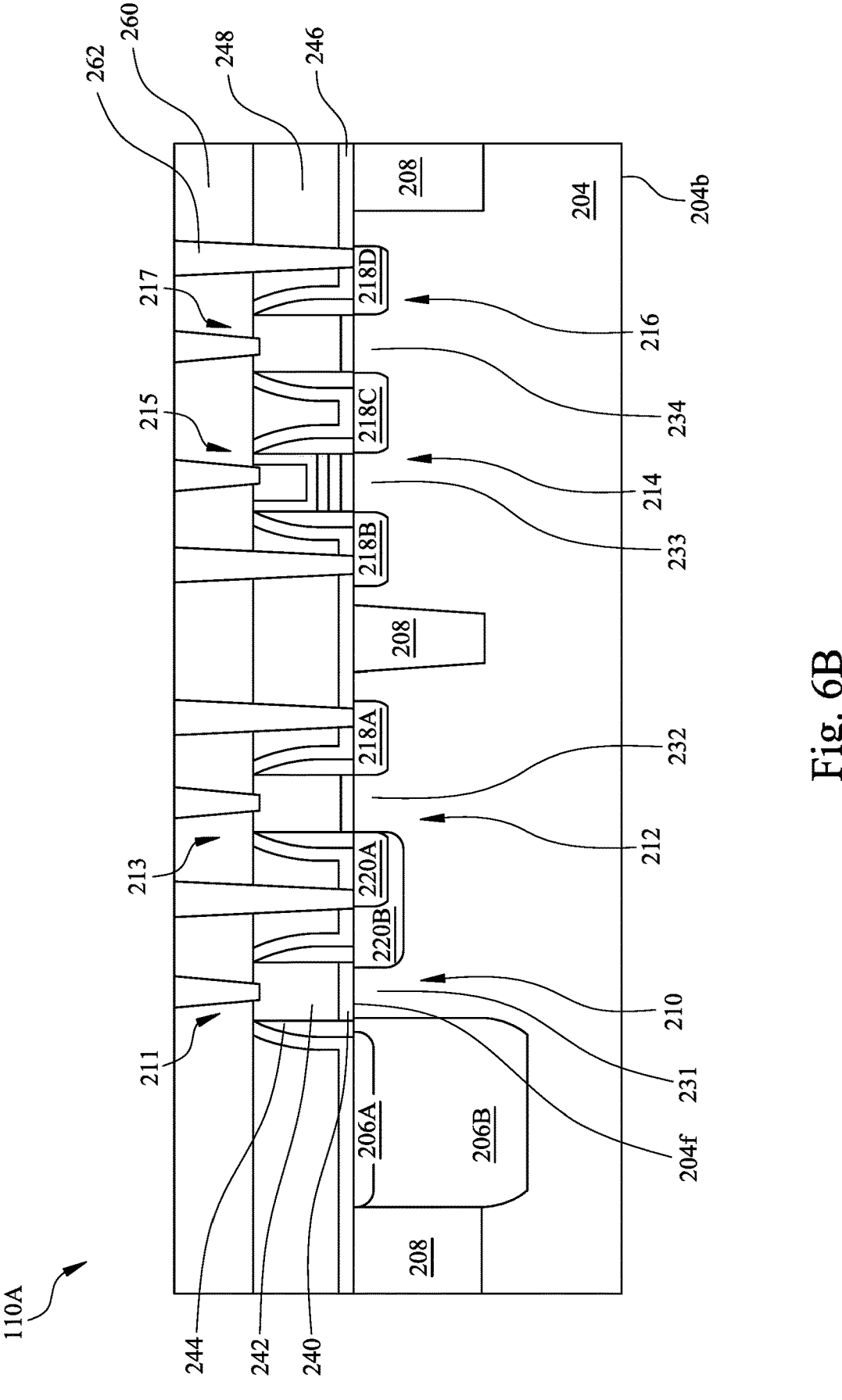
FIG. 6B is a schematic sectional view of a structure in the pixel device of FIG. 6A.

FIG. 6A is a schematic circuit diagram of a pixel device 110A according to embodiments of the present disclosure. FIG. 6B is a schematic sectional view of a structure in the pixel device 110A. The pixel device 110A may be similar to the pixel device 110 in FIG. 2C, except that in the pixel device 110A, the transfer transistor 210, the reset transistor 212, and the select transistor 216 include gate structures of a first composition while the source-follower transistor 214 includes a gate structure of a second composition different from the first composition. In some embodiments, the first composition includes a polycrystalline silicon containing gate electrode layer. The second composition includes a high-k dielectric gate. In some embodiments, the second composition includes a ferroelectric layer.

Figure 7B:
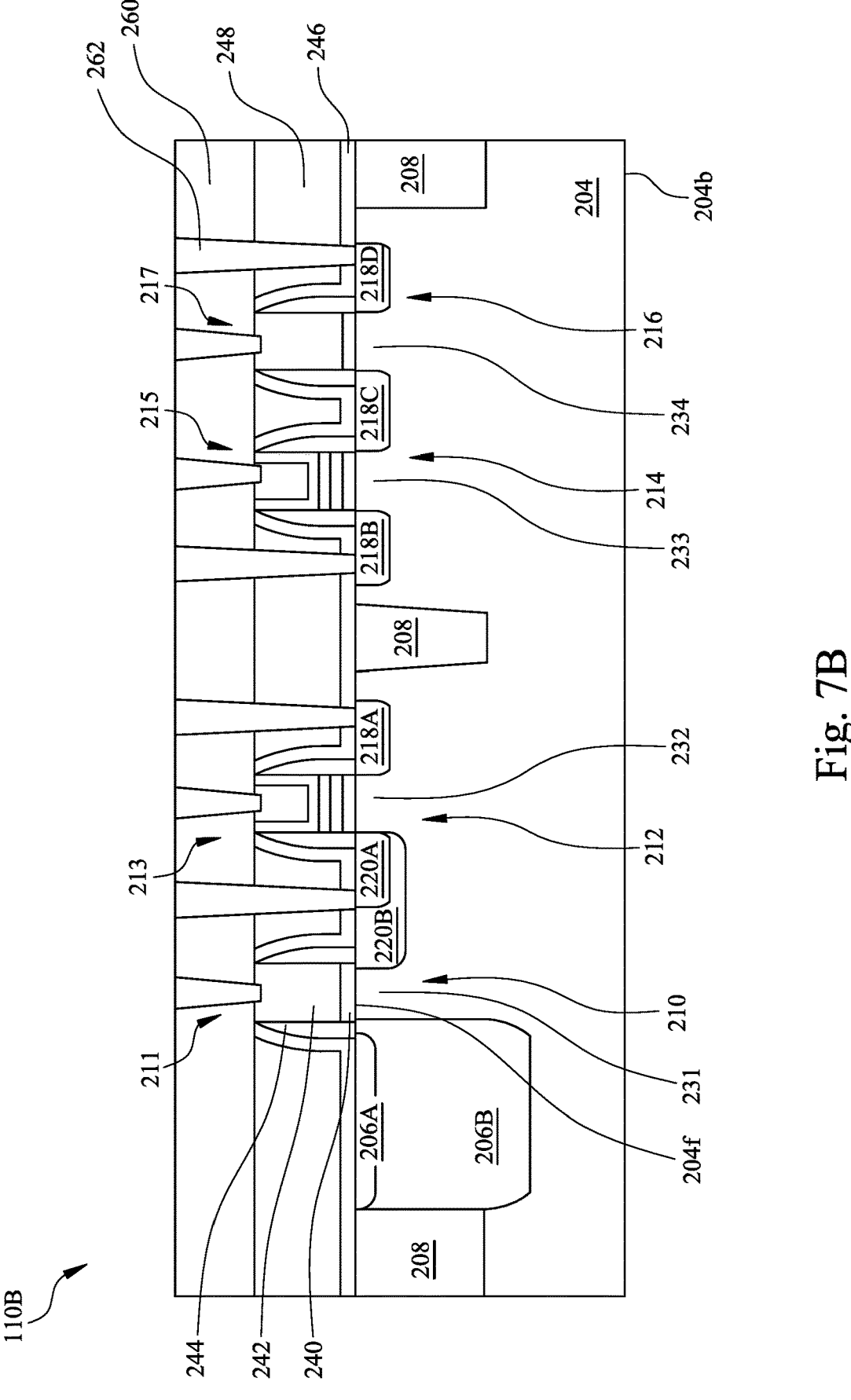
FIG. 7B is a schematic sectional view of a structure in the pixel device of FIG. 7A.

FIG. 7A is a schematic circuit diagram of a pixel device 110B according to embodiments of the present disclosure. FIG. 7B is a schematic sectional view of a structure in the pixel device 110B. The pixel device 110B may be similar to the pixel device 110 in FIG. 2C, except that in the pixel device 110B, the transfer transistor 210 and the reset transistor 212 include gate structures of a first composition while the source-follower transistor 214 and the select transistor 216 include gate structures of a second composition different from the first composition. In some embodiments, the first composition includes a polycrystalline silicon containing gate electrode layer. The second composition includes a high-k dielectric gate. In some embodiments, the second composition includes a ferroelectric layer.

Figure 8B:
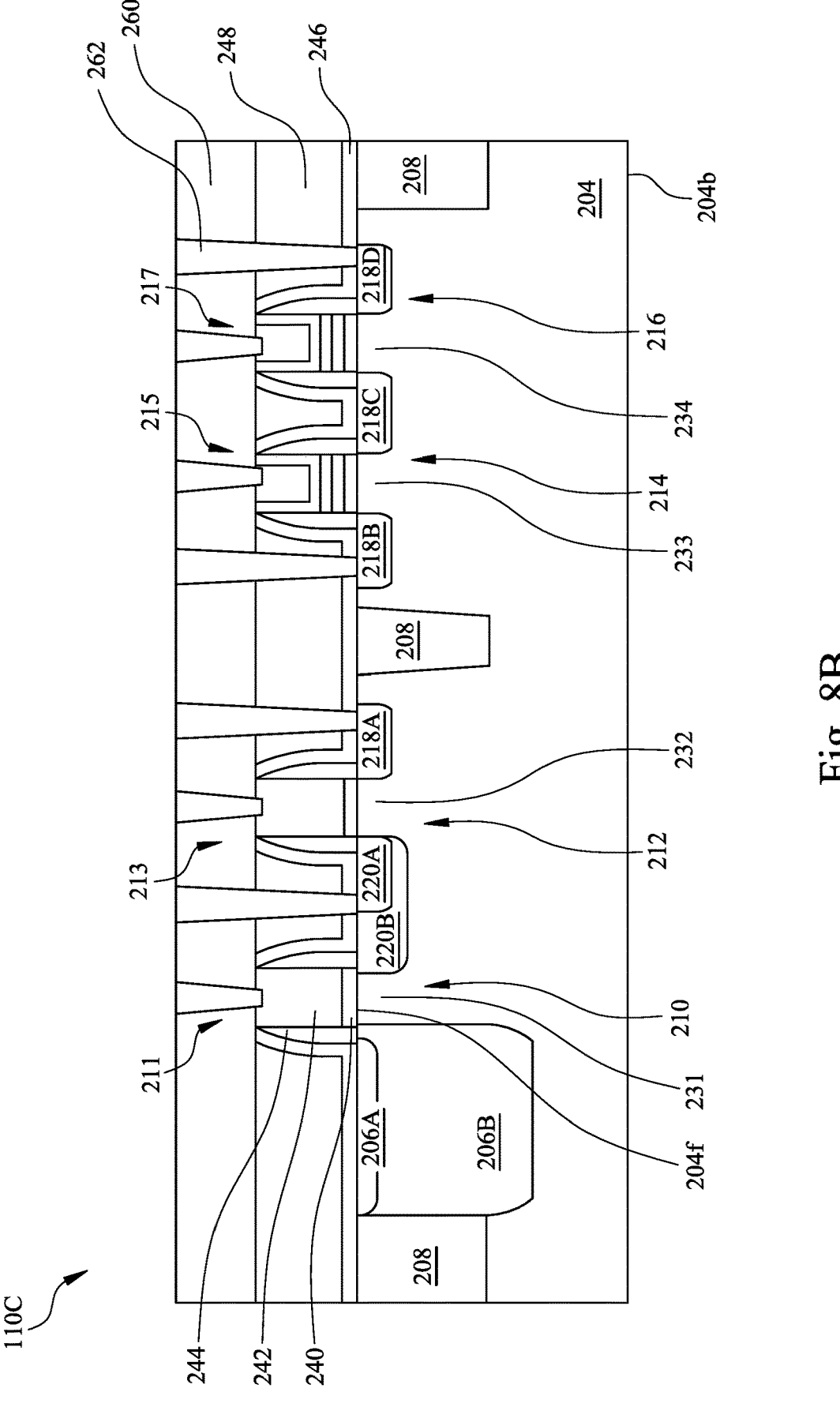
FIG. 8B is a schematic sectional view of a structure in the pixel device of FIG. 8A.

FIG. 8A is a schematic circuit diagram of a pixel device 110C according to embodiments of the present disclosure. FIG. 8B is a schematic sectional view of a structure in the pixel device 110C. The pixel device 110C may be similar to the pixel device 110 in FIG. 2C, except that in the pixel device 110C, the transfer transistor 210 and the select transistor 216 include gate structures of a first composition while the source-follower transistor 214 and the reset transistor 212 include gate structures of a second composition different from the first composition. In some embodiments, the first composition includes a polycrystalline silicon containing gate electrode layer. The second composition includes a high-k dielectric gate. In some embodiments, the second composition includes a ferroelectric layer.

Image sensing devices according to present disclosure include metal gate structures in a pixel device. Particularly, the metal gate structures include a ferroelectric layer and a conductive layer to form a negative capacitance device in the gate stack. As a result, the transistors in the pixel device have reduced threshold swing, improved gain and reduced threshold voltage shift. The pixel device according to the present disclosure includes a combination of metal gate and polycrystalline gate, which provides flexibility in pixel device design and improves performance.

It will be understood that not all advantages have been necessarily discussed herein, no particular advantage is required for all embodiments or examples, and other embodiments or examples may offer different advantages.

Some embodiments of the present disclosure provide an image sensing device, comprising, an array of pixel devices, wherein at least one pixel devices comprises a semiconductor substrate including a radiation region, a floating diffusion region, two or more doped regions, a first gate structure disposed on the semiconductor substrate, wherein the first gate structure overlaps with the radiation region and the floating diffusion region, a second gate structure disposed on the semiconductor substrate, wherein the second gate structure overlaps with the two or more doped regions, the first gate structure and the second gate structure include different arrangements of material layers.

Some embodiments of the present disclosure provide an image sensing device, comprising a photodetector comprising a first pinned layer and a second pinned layer, a transfer transistor comprising a transfer gate overlapping with a portion of the photodetector, wherein the transfer gate includes a first group of material layers, a source-follower transistor comprising a source-follower gate, a reset transistor comprising a reset gate, and a select transistor comprising a select gate, wherein at least one of the source-follower gate, the reset gate, and the select gate includes a second group of material layers different from the first group of material layers.

Some embodiments of the present disclosure provide a method for forming an image sensing device. The method comprises providing a substrate, forming an insolation structure in the substrate to define a pixel device region therein, forming two or more first gate structures over the pixel device region, doping the substrate to form source/drain regions on opposite sides of the two or more first gate structures, and removing at least one of the two or more first gate structures, forming a second gate structure in place of removed first gate structure, wherein the second gate structure and the first gate structures have different arrangement of material layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming an image sensing device, comprising:
   providing a substrate;
   forming an isolation structure in the substrate to define a pixel device region therein;
   forming two or more first gate structures over the pixel device region;
   doping the substrate to form source/drain regions on opposite sides of the two or more first gate structures;
   removing at least one of the two or more first gate structures; and
   forming a second gate structure in place of removed first gate structure, wherein the second gate structure and the first gate structures have different arrangement of material layers, and the second gate structure comprises a ferroelectric layer.

2. The method of claim 1, wherein forming the second gate structure comprises:
   depositing a high-k gate dielectric layer;
   depositing an inner gate electrode layer over the high-k gate dielectric layer;
   depositing the ferroelectric layer on the inner gate electrode layer; and
   depositing a top electrode layer on the ferroelectric layer.

3. The method of claim 2, wherein forming the first gate structures comprises:
   depositing a gate dielectric layer on the substrate;
   depositing a gate electrode layer on the gate dielectric layer, wherein the gate electrode layer comprises a polycrystalline silicon; and
   patterning the gate electrode layer and the gate dielectric layer to form the two or more first gate structures from the gate electrode layer and the gate dielectric layer.

4. The method of claim 3, wherein forming the two or more first gate structures comprises: forming a transfer gate, a reset gate, a source-follower gate, and a select gate on the substrate over the pixel device region.

5. The method of claim 4, wherein doping the substrate comprises:

doping the substrate to form a radiation region, a floating diffusion region, wherein the radiation region and the floating diffusion region are on opposite sides of the transfer gate; and doping the substrate to form doped regions on opposite sides of the reset gate, the source-follower gate, and the select gate.

6. The method of claim 4, wherein removing at least one of the two or more first gate structures comprises:

forming a photoresist layer to cover the transfer gate; and removing at least one of the reset gate, the source-follower gate and the select gate.

7. A method of forming a pixel device, comprising:

forming a radiation region, a floating diffusion region, and two or more doped regions in a semiconductor substrate;

forming a first gate structure on the semiconductor substrate, wherein the first gate structure overlaps with the radiation region and the floating diffusion region, wherein forming the first gate structure comprises:

depositing a first gate dielectric layer on the semiconductor substrate; and depositing a first gate electrode layer on the first gate dielectric layer, wherein the first gate electrode layer comprises a polycrystalline silicon; and forming a second gate structure on the semiconductor substrate, wherein the second gate structure overlaps with the two or more doped regions, the first gate structure and the second gate structure include different arrangements of material layers, and at least one of the first gate structure and the second gate structure comprises a high-k gate dielectric layer having a k value greater than about 7.0, and the second gate structure is formed by a replacement gate process.

8. The method of claim 7, wherein forming the second gate structure comprises:

depositing a second gate dielectric layer on the semiconductor substrate;

depositing an inner gate electrode layer on the second gate dielectric layer;

depositing a ferroelectric layer over the inner gate electrode layer; and depositing a top gate electrode layer over the ferroelectric layer.

9. The method of claim 8, wherein forming the second gate structure further comprising:

forming a work function metal layer between the ferroelectric layer and the top gate electrode layer.

10. The method of claim 8, wherein the second gate dielectric layer comprises the high-k dielectric material.

11. The method of claim 7, wherein the second gate structure includes a negative capacitance device.

12. The method of claim 7, further comprising forming a third gate structure on the substrate, wherein the third gate structure comprises the first gate dielectric layer and the first gate electrode layer.

13. The method of claim 7, further comprising forming a third gate structure on the substrate, wherein the third gate structure comprises a ferroelectric layer.

14. A method, comprising:

forming an image sensing device comprising:

a photodetector comprising a first pinned layer and a second pinned layer;

a transfer transistor comprising a transfer gate overlapping with a portion of the photodetector, wherein the transfer gate includes a first group of material layers;

a source-follower transistor comprising a source-follower gate;

a reset transistor comprising a reset gate; and a select transistor comprising a select gate, wherein at least one of the source-follower gate, the reset gate, and the select gate includes a second group of material layers different from the first group of material layers, wherein at least one of the transfer gate, the source-follower gate, the reset gate and the select gate is fabricated by a replacement gate process.

15. The method of claim 14, wherein the second group of material layers comprises:

a high-k gate dielectric layer; and a metallic gate electrode layer.

16. The method of claim 15, wherein the second group of material layers further comprises:

a ferroelectric layer disposed between the high-k gate dielectric layer and the metallic gate electrode layer.

17. The method of claim 16, wherein the second group of material layers further comprises:

a conductive layer disposed between the high-k gate dielectric layer and the ferroelectric layer.

18. The method of claim 16, wherein the first group of material layers comprises a polycrystalline silicon layer.

19. The method of claim 14, wherein at least one of the transfer gate, the source-follower gate, the reset gate and the select gate includes a negative capacitance device.

20. The method of claim 15, wherein the high-k dielectric layer has a k-value greater than about 7.0.

* * * * *